United States Patent
Kim et al.

(10) Patent No.: US 7,977,257 B2
(45) Date of Patent: Jul. 12, 2011

(54) METHODS OF MANUFACTURING SEMICONDUCTOR DEVICES

(75) Inventors: Weon-Hong Kim, Suwon-si (KR);
Min-Woo Song, Seongnam-si (KR);
Pan-Kwi Park, Suwon-si (KR);
Jung-Min Park, Ansan-si (KR)

(73) Assignee: Samsung Electronics Co., Ltd. (KR)

( * ) Notice: Subject to any disclaimer, the term of this patent is extended or adjusted under 35 U.S.C. 154(b) by 125 days.

(21) Appl. No.: 12/383,810

(22) Filed: Mar. 27, 2009

(65) Prior Publication Data

US 2009/0246949 A1  Oct. 1, 2009

(30) Foreign Application Priority Data

Mar. 27, 2008  (KR) .................. 10-2008-0028510

(51) Int. Cl.
*H01L 21/31* (2006.01)
*H01L 21/469* (2006.01)
(52) U.S. Cl. .................. 438/778; 257/303; 257/E21.487
(58) Field of Classification Search .................. 438/778, 438/253, 396, 785; 257/303, 532, E21.487, 257/E21.495
See application file for complete search history.

(56) References Cited

U.S. PATENT DOCUMENTS

| 2004/0217478 A1* | 11/2004 | Yamamoto et al. ........... 257/758 |
| 2006/0097305 A1 | 5/2006 | Lee |
| 2006/0121671 A1 | 6/2006 | Yamamoto et al. |

FOREIGN PATENT DOCUMENTS

| JP | 2004-296582 | 10/2004 |
| KR | 10-2006-0052474 A | 5/2006 |
| KR | 10-2007-0093190 A | 9/2007 |

* cited by examiner

*Primary Examiner* — Walter L Lindsay, Jr.
(74) *Attorney, Agent, or Firm* — Mills & Onello, LLP

(57) ABSTRACT

In a semiconductor device and a method of manufacturing a semiconductor device, a lower electrode is formed on a semiconductor substrate. A first zirconium oxide layer is formed on the lower electrode by performing a first deposition process using a first zirconium source and a first oxidizing gas. A zirconium carbo-oxynitride layer is formed on the first zirconium oxide layer by performing a second deposition process using a second zirconium source, a second oxidizing gas and a nitriding gas, and an upper electrode is formed on the zirconium carbo-oxynitride layer. A zirconium oxide-based composite layer having a high dielectric constant and a thin equivalent oxide thickness can be obtained.

15 Claims, 33 Drawing Sheets

METHODS OF MANUFACTURING SEMICONDUCTOR DEVICES

RELATED APPLICATION

This application claims priority under 35 USC §119 to Korean Patent Application No. 2008-28510, filed on Mar. 27, 2008 in the Korean Intellectual Property Office (KIPO), the contents of which are herein incorporated by reference in their entirety.

BACKGROUND

1. Field

Example embodiments relate to semiconductor devices having a dielectric layer of a high dielectric constant and to methods of manufacturing semiconductor devices.

2. Description of the Related Art

As a result of semiconductor devices becoming more highly integrated, the area of a unit cell has been significantly reduced, and the operational voltage has been lowered, as well. Accordingly, a dielectric layer having a high dielectric constant (high-k) has been applied to semiconductor devices to enhance electrical storage performance and/or to suppress leakage current through the dielectric layer.

Generally, a high-k dielectric layer has a thin equivalent oxide thickness (i.e., a low thickness of $SiO_2$ gate oxide would exhibit the same gate capacitance) and a high dielectric constant, so the high-k dielectric layer may improve the capacitance of a capacitor or a coupling ratio of a flash memory device, or the high-k dielectric layer may provide a proper threshold voltage of a metal gate structure.

For example, a hafnium oxide ($HfO_2$) layer, a tantalum oxide ($Ta_2O_5$) layer, an aluminum oxide ($Al_2O_3$) layer and a zirconium oxide ($ZrO_2$) layer have been used as the high-k dielectric layer of a capacitor (e.g., a metal-insulator-metal capacitor). These dielectric layers have a high dielectric constant, so these dielectric layers may improve dielectric characteristics of a device. As a design rule decreases, a dielectric layer having a very thin equivalent oxide thickness has also been utilized for a further scaling down. Further, these dielectric layers may be crystallized during a subsequent annealing process. When crystallization of a dielectric layer occurs, a threshold voltage of a gate may not be uniform along a channel length, and a leakage current that deteriorates the reliability of the semiconductor device may be generated.

SUMMARY

Example embodiments include methods of manufacturing a semiconductor device including a high dielectric layer, which can have a high dielectric constant and/or a thin equivalent oxide thickness and can reduce generation of a leakage current.

Example embodiments also include semiconductor devices that include a high dielectric layer, which can have a high dielectric constant and/or a thin equivalent oxide thickness and can reduce generation of a leakage current.

In some example embodiments of a method for manufacturing a semiconductor device, a lower electrode can be formed on a semiconductor substrate. A first zirconium oxide layer can be formed on the lower electrode by performing a first deposition process using a first zirconium source and a first oxidizing gas. A zirconium carbo-oxynitride layer having zirconium, oxygen, carbon and nitrogen can be formed on the first zirconium oxide layer by performing a second deposition process using a second zirconium source, a second oxidizing gas and a nitriding gas. An upper electrode can be formed on the zirconium carbo-oxynitride layer.

In example embodiments, the first zirconium oxide layer can be formed on the lower electrode by (a) providing the first zirconium source onto the lower electrode to form an adsorption layer of the first zirconium source on the lower electrode; (b) providing a purging gas to remove a non-adsorbed portion of the first zirconium source; (c) providing the first oxidizing gas to oxidize the adsorption layer of the first zirconium source; and (d) providing a purging gas to remove a non-reacted portion of the first oxidizing gas.

In example embodiments, the zirconium carbo-oxynitride layer can be formed on the first zirconium oxide layer by (e) supplying the second zirconium source to the first zirconium oxide layer to form an adsorption layer of the second zirconium source on the first zirconium oxide layer; (f) providing a purging gas to remove a non-adsorbed portion of the second zirconium source; (g) supplying the second oxidizing gas to the first zirconium oxide layer to form an oxidized adsorption layer of the second zirconium source on the first zirconium oxide layer; (h) providing a purging gas to remove a non-reacted portion of the second oxidizing gas; (i) supplying the nitriding gas to the oxidized adsorption layer of the second zirconium source to form a zirconium carbo-oxynitride layer on the first zirconium oxide layer; and (j) providing a purging gas to remove a non-reacted portion of the nitriding gas.

In example embodiments, the steps from (e) through (j) can be repeated in a cycle to form a plurality of atomic layers of zirconium carbo-oxynitride on the first zirconium oxide layer. The plurality of atomic layers of zirconium carbo-oxynitride can have a chemical formula of $ZrO_{2-x-y}C_xN_y$, in which x and y satisfy $0<x<2$, $0<y<2$ and $0<x+y<2$, and at least two of the atomic layers have different values for at least one of x and y from each other. The plurality of atomic layers of zirconium carbo-oxynitride can have a chemical formula of $ZrO_{2-x-y}C_xN_y$, in which x and y satisfy $0<x<2$, $0<y<2$ and $0<x+y<2$, and the plurality of atomic layers has a repeating unit of at least two atomic layers that have different values for at least one of x and y from each other.

In example embodiments, a reaction of the nitriding gas and the oxidized adsorption layer of the second zirconium source can be activated by plasma.

In example embodiments, each of the first and second zirconium sources can include tetrakis(dialkylamino)zirconium.

In example embodiments, each of the first and the second oxidizing gases can independently include at least one gas selected from oxygen ($O_2$), ozone ($O_3$) and water vapor ($H_2O$). In example embodiments, the nitriding gas can include at least one gas selected from ammonia ($NH_3$), nitrous oxide ($N_2O$) and nitric oxide (NO).

In example embodiments, prior to forming the upper electrode, a second zirconium oxide layer can be formed on the zirconium carbo-oxynitride layer by performing a third deposition process using a third zirconium source and a third oxidizing gas under an oxidation atmosphere to reduce oxidization of the zirconium carbo-oxynitride layer.

In example embodiments, a reaction of the third zirconium source and the third oxidizing gas may not be activated by plasma, or may be activated by plasma with a sufficiently low energy to reduce oxidization of the zirconium carbo-oxynitride layer.

In example embodiments, the third deposition process can be performed using the third oxidizing gas including at least one of ozone ($O_3$) and water vapor ($H_2O$) without plasma activation.

In example embodiments, a tunnel oxide layer can be formed on a semiconductor substrate before forming the lower electrode. The lower electrode can be provided as a floating gate electrode; the first zirconium oxide layer and the zirconium carbo-oxynitride layer can be provided as a dielectric layer; and the upper electrode can be provided as a control gate electrode.

According to example embodiments, a semiconductor device can include a lower electrode formed on a semiconductor substrate; a first zirconium oxide layer formed on the lower electrode; a zirconium carbo-oxynitride layer having zirconium, oxygen, carbon and nitrogen formed on the first zirconium oxide layer; and an upper electrode formed on the zirconium carbo-oxynitride layer.

In example embodiments, the semiconductor device can further include a second zirconium oxide layer between the zirconium carbo-oxynitride layer and the upper electrode.

In example embodiments, the semiconductor device can further include a tunnel oxide layer formed between the semiconductor substrate and a lower electrode. The lower electrode can be provided as a floating gate electrode, the first zirconium oxide layer and the zirconium carbo-oxynitride layer can be provided as a dielectric layer, and the upper electrode can be provided as a control gate electrode.

In example embodiments, the zirconium carbo-oxynitride layer can include a plurality of atomic layers having a chemical formula of $ZrO_{2-x-y}C_xN_y$, in which x and y satisfy $0<x<2$, $0<y<2$ and $0<x+y<2$, and at least two of the atomic layers have different values for at least one of x and y from each other.

In example embodiments, the zirconium carbo-oxynitride layer can include a plurality of atomic layers having a chemical formula of $ZrO_{2-x-y}C_xN_y$, in which x and y satisfy $0<x<2$, $0<y<2$ and $0<x+y<2$, and the plurality of atomic layers has a repeating unit of at least two atomic layers that have different values for at least one of x and y.

According to example embodiments, the zirconium-oxide-based composite layer can be obtained by sequentially forming a first zirconium oxide layer and a zirconium carbo-oxynitride layer or by further forming a second zirconium oxide layer on the zirconium carbo-oxynitride layer. The zirconium-oxide-based composite layer can have a high dielectric constant and a thin equivalent oxide thickness. Therefore, a dimension of a dielectric layer in a device can be reduced, and a highly integrated device having an increased number of cells can be manufactured.

Further, the zirconium oxide/zirconium carbo-oxynitride/zirconium oxide layer obtained by example embodiments can have improved leakage current characteristics because the second zirconium oxide layer is formed under a relatively weak oxidation atmosphere to reduce the oxidation of the zirconium carbo-oxynitride layer.

Additionally, the zirconium-oxide-based composite layer can have a high temperature of crystallization compared with a uniform zirconium-oxide layer. Thus, generation of a leakage current through a crystallized portion can be reduced or suppressed, and a device having a uniform threshold voltage along a channel length can be obtained. Further, a temperature margin of a thermal process performed after forming the zirconium carbo-oxynitride layer can be raised.

BRIEF DESCRIPTION OF THE DRAWINGS

Example embodiments will be more clearly understood from the following description taken in conjunction with the accompanying drawings. FIGS. 1-35 represent non-limiting, example embodiments as described herein.

FIGS. 1 through 4 are flow charts illustrating a method of forming a dielectric layer according to example embodiments.

FIG. 5 is a diagram illustrating exemplary sequences of providing reactive gases in a method of forming the first zirconium oxide layer through an atomic-layer-deposition (ALD) process.

FIG. 6 is a diagram illustrating exemplary sequences of providing reactive gases in a method of forming the zirconium carbo-oxynitride layer through an ALD process.

FIG. 7 is a graph illustrating a relation of an equivalent oxide thickness (EOT) and a breakdown voltage (BV) to induce 1 fA/cell in a dielectric layer of zirconium oxide/aluminum oxide/zirconium oxide ($ZrO_2/Al_2O_3/ZrO_2$, ZAZ).

FIG. 8 is a graph illustrating a leakage current density (A/cell) vs. applied voltage (V) measured from a capacitor having a dielectric layer of zirconium oxide/zirconium carbo-oxynitride/zirconium oxide ($ZrO_2/ZrOCN/ZrO_2$, ZNZ).

FIGS. 10 through 17B are cross-sectional views illustrating a method of manufacturing a dynamic random access memory (DRAM) device according to example embodiments.

FIGS. 18 through 21B are cross-sectional views illustrating a method of manufacturing a capacitor of a logic device according to example embodiments.

FIGS. 22 through 25B are cross-sectional views illustrating a method of manufacturing a decoupling capacitor of a logic device according to example embodiments.

FIGS. 26 through 30B are cross-sectional views illustrating a method of manufacturing a flash memory device according to example embodiments.

FIGS. 31A through 32B are cross-sectional views illustrating a method of manufacturing a gate structure according to example embodiments.

FIGS. 33 through 35 are block diagrams illustrating systems including a memory device in accordance with example embodiments.

DETAILED DESCRIPTION OF EXAMPLE EMBODIMENTS

Figure 1:
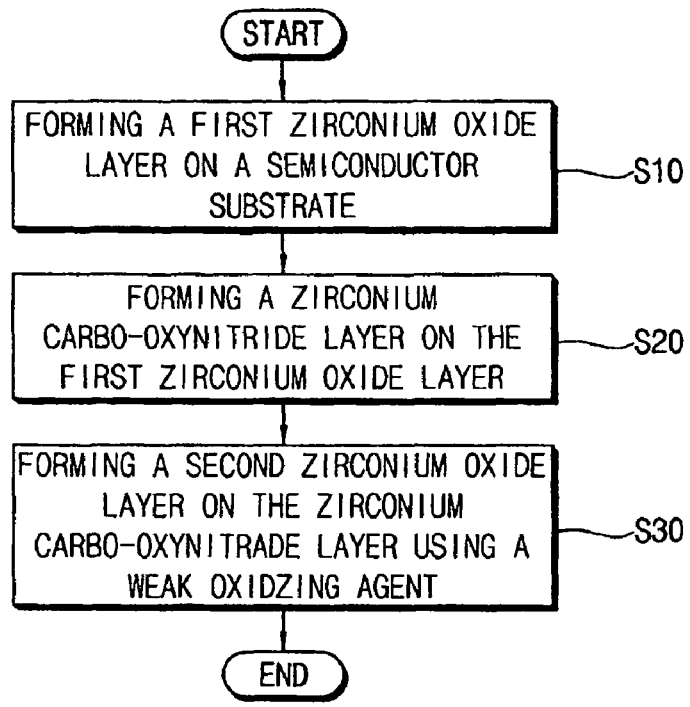

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms (e.g., "beneath," "below," "lower," "above," "upper" and the like) may be used herein for ease of description to describe one element or feature's relationship to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath," other elements or features would be oriented "above" the other elements or features. Thus, the exemplary term, "below," may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms, "a," "an" and "the," are intended to include the plural forms as well, unless the context clearly indicates otherwise. It will be further understood that the terms, "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Where a plurality of compositions are cited, any one or more of the cited compositions, as well as others, can be selected for use in an embodiment.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which example embodiments belong. It will be further understood that terms (e.g., those defined in commonly used dictionaries) should be interpreted as having a meaning that is consistent with their meaning in the context of the relevant art and will not be interpreted in an idealized or overly formal sense unless expressly so defined herein.

Methods of Forming a Dielectric Layer

Example embodiments include methods of forming a dielectric layer of zirconium-oxide-based multi-layer composites on a substrate. The dielectric layer of zirconium-oxide-based multi-layer composites can have a high dielectric constant and can reduce generation of a leakage current. In some example embodiments, a double layer of zirconium oxide and zirconium carbo-oxynitride ($ZrO_2/ZrOCN$) can be formed on a substrate. In other example embodiments, a triple layer of zirconium oxide, zirconium carbo-oxynitride and zirconium oxide ($ZrO_2/ZrOCN/ZrO_2$) can be formed on a substrate. The dielectric layer can be formed by an atomic-layer-deposition (ALD) process or by a plasma-enhanced ALD (PEALD) process.

The flow chart of FIG. 1 illustrates a method of forming a dielectric layer according to example embodiments. Referring to FIG. 1, a first zirconium oxide layer can be formed on a semiconductor substrate (S10), and then a zirconium carbo-oxynitride layer can be formed on the first zirconium oxide layer (S20). Additionally, a second zirconium oxide layer can be formed on the zirconium carbo-oxynitride layer using a weak oxidizing agent (S30). The formation of the second zirconium oxide layer on the zirconium carbo-oxynitride layer can optionally be performed to improve the dielectric constant per unit thickness.

The semiconductor substrate can be a bare wafer or a wafer on which other structures (e.g., impurity regions, gate electrodes, insulation layers, conductive layers, contacts, plugs and/or wirings) are formed. For example, the following components can be formed on the semiconductor substrate: a gate electrode, an insulating interlayer covering the gate electrode, a contact plug connecting a capacitor to an impurity region of the semiconductor substrate, and a lower electrode on the contact plug.

Figure 2:
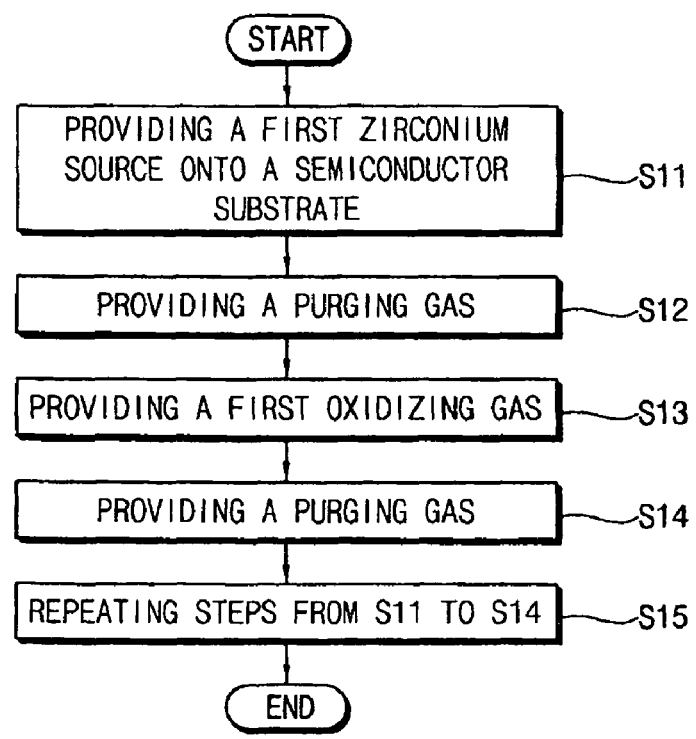

The flow chart of FIG. 2 illustrates a method of forming the first zirconium oxide layer on the semiconductor substrate according to example embodiments. Referring to FIG. 2, a first zirconium source can be supplied to a semiconductor substrate, and the semiconductor substrate can be loaded into a chamber (S11). The first zirconium source can be adsorbed onto the semiconductor substrate to form an adsorption layer of the first zirconium source, and the adsorption layer can include one or more atomic or molecular layers of the first zirconium source.

The first zirconium source can include zirconium and alkylamino ligands. For example, the first zirconium source can be tetrakis(dialkylamino)zirconium. Non-limiting examples of tetrakis(dialkylamino)zirconium can include tetrakis(ethylmethylamino)zirconium ($Zr[N(CH_3)(CH_2CH_3)]_4$, TEMAZ) represented by Formula 1 (below), tetrakis(diethylamino)zirconium ($Zr[N(CH_2CH_3)2]_4$), tetrakis (dimethylamino)zirconium ($Zr[N(CH_3)2]_4$) and the like.

Formula 1:

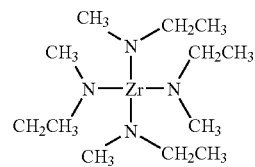

A purging process can be performed on the chamber having the semiconductor substrate (S12). By performing the purging process, a non-adsorbed portion of the zirconium source can be removed from the semiconductor substrate and the chamber, and the adsorption of the zirconium source can remain on the semiconductor substrate. The purging process can be performed using an inactive gas or an inert gas [e.g., argon (Ar), helium (He) or nitrogen ($N_2$)].

A first oxidizing gas can be supplied onto the semiconductor substrate (S13). The first oxidizing gas can be a reactive gas to oxidize the first zirconium source of the adsorption layer. Accordingly, a first zirconium oxide layer can be formed on the semiconductor substrate. Various oxidizing gases having different oxidizing abilities can be used. Non-limiting examples of the oxidizing gas can include oxygen ($O_2$), ozone ($O_3$), water vapor ($H_2O$) and the like. The reaction of the first zirconium source and the first oxidizing gas can be activated by plasma.

A purging process can be performed to remove a non-reacted portion of the first oxidizing gas from the semiconductor substrate and from the chamber (S14). The second purging process can also be performed using an inactive gas or an inert gas.

The above steps from S11 to S14 can be repeatedly performed to obtain a predetermined thickness of the first zirconium oxide layer. The steps from S11 to S14 can be repeated in a cycle. A layer obtained by performing a single cycle can have a very thin thickness, such as an atomic layer, so the first zirconium oxide layer can be obtained by repeating the cycle several tens of times or several hundred times, as a function of a desired thickness and desired properties of the dielectric layer or a need of a device. For example, the first zirconium oxide layer can be formed by repeating the cycle about 40 to about 50 times to produce a thickness of about 30-50 Å.

Figure 5:
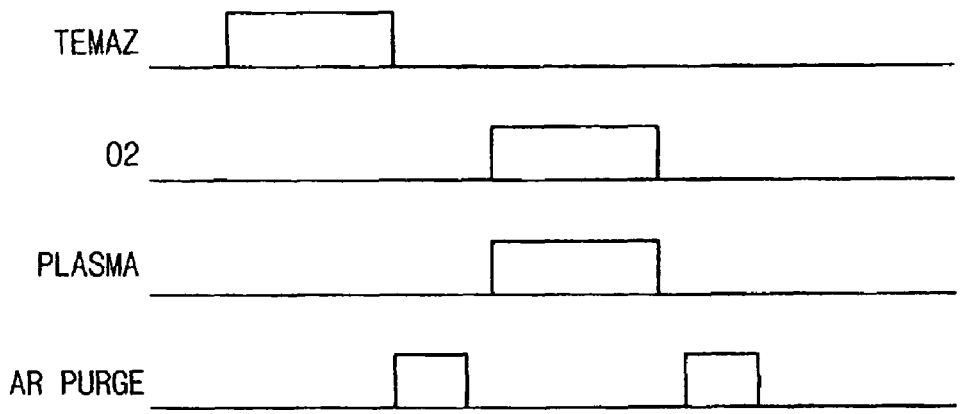

The diagram of FIG. 5 illustrates exemplary sequences of providing reactive gases in a method of forming the first zirconium oxide layer through an atomic-layer-deposition process. As illustrated in FIG. 5, the first zirconium oxide layer can be formed by sequentially and repeatedly providing a first zirconium source (e.g., TEMAZ), a purging gas (e.g., Ar), a first oxidizing gas (e.g., $O_2$) and a purging gas (e.g., Ar). After or while the oxidizing gas is provided, plasma can also be provided.

Figure 3:
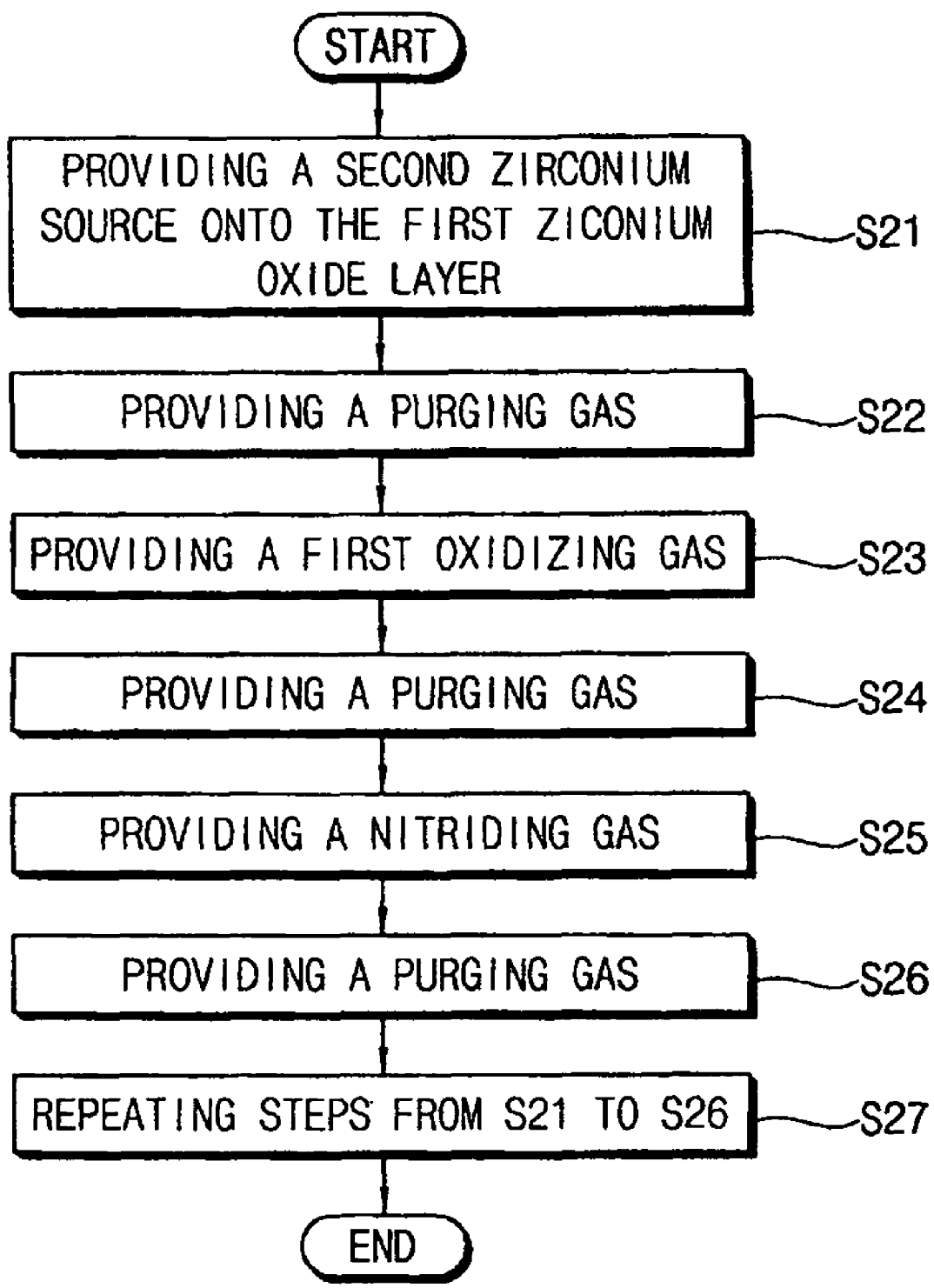

After forming a first zirconium oxide layer on a semiconductor substrate, a zirconium carbo-oxynitride layer can be formed on the first zirconium oxide layer (S20). The flow chart of FIG. 3 illustrates a method of forming the zirconium carbo-oxynitride layer on the first zirconium oxide layer according to example embodiments. Referring to FIG. 3, a second zirconium source can be supplied onto the first zirconium oxide layer in a chamber to form an adsorption layer of the second zirconium source (S21). The second zirconium source can be the same as or different from the first zirconium source. For example, the second zirconium source can be tetrakis(dialkylamino)zirconium (TEMAZ). A purging process can be performed to remove a non-adsorbed portion of the second zirconium source from the semiconductor substrate (S22) using an inactive gas or an inert gas [e.g., argon (Ar), helium (He) or nitrogen ($N_2$)].

A second oxidizing gas can be supplied to the first zirconium oxide layer (S23). The second oxidizing gas can be a reactive gas to partially or fully oxidize the second zirconium source of the adsorption layer. Non-limiting examples of the second oxidizing gas can include oxygen ($O_2$), ozone ($O_3$), water vapor ($H_2O$) and the like. An oxidizing gas having a relatively low oxidizing ability (e.g., oxygen gas) can be employed to partially oxidize the adsorption layer of the second zirconium source. A purging process can be performed to remove a non-reacted portion of the second oxidizing gas from the semiconductor substrate and the chamber (S24).

After performing the purging process, a nitriding gas can be supplied onto the semiconductor substrate (S25). The nitriding gas can be a reactive gas to nitride the oxidized adsorption layer of the second zirconium source. Non-limiting examples of the nitriding gas can include ammonia ($NH_3$), nitrous oxide ($N_2O$), nitric oxide (NO) and the like. By nitriding the oxidized adsorption layer of the second zirconium source, a zirconium carbo-oxynitride layer having zirconium, carbon, oxygen and nitrogen can be formed on the semiconductor substrate. The zirconium carbo-oxynitride layer can include carbon, which can be mainly originated from organic ligands of the second zirconium source.

In some embodiments, the provided nitriding gas can be activated by plasma. That is, plasma nitriding can be performed, and plasma can be provided after or while the nitriding gas is provided. Plasma can activate reaction of the nitriding gas with the partially or fully oxidized zirconium source so the oxidized second zirconium source and the nitriding gas can be well combined, and a zirconium carbo-oxynitride layer having improved structural stability can be obtained.

A purging process can be performed to remove a non-reacted portion of the nitriding gas from the semiconductor substrate and from the chamber (S26). The above steps from S21 to S26 can be repeatedly performed, in a repeating cycle, to obtain a predetermined thickness of the zirconium carbo-oxynitride layer. For example, the zirconium carbo-oxynitride layer can be formed by repeating the cycle about 20 to about 50 times to produce a thickness of about 10-50 Å.

By providing the second oxidizing gas prior to the nitriding gas, a zirconium carbo-oxynitride layer having a limited amount of carbon and/or nitrogen can be obtained; consequently, the zirconium carbo-oxynitride layer can have a high dielectric constant, similar to that of a zirconium oxide layer. Further, carbon and nitrogen contained in the zirconium carbo-oxynitride layer can inhibit crystalline growth of zirconium oxide to reduce leakage current characteristics.

The zirconium carbo-oxynitride layer can have a chemical formula of $ZrO_{2-x-y}C_xN_y$, in which x and y satisfy $0<x<2$, $0<y<2$ and $0<x+y<2$. In example embodiments, the zirconium carbo-oxynitride layer can include a plurality of atomic layers or sub-layers of zirconium carbo-oxynitride having a chemical formula of $ZrO_{2-x-y}C_xN_y$, in which x and y satisfy $0<x<2$, $0<y<2$ and $0<x+y<2$. At least two of the atomic layers can have different values of x and/or y from each other. In other example embodiments, the plurality of atomic layers can have a repeating unit of at least two atomic layers that have different values of x and/or y from each other.

The zirconium carbo-oxynitride layer can be formed by changing feed times (or feed amounts) of the oxidizing gas and/or the nitriding gas while a plurality of cycles are performed. A zirconium carbo-oxynitride layer having different amounts of oxygen, carbon and/or nitrogen in a plurality of atomic layers may not be readily crystallized in all atomic layers, although crystallization can occur in a single atomic layer of the zirconium carbo-oxynitride layer. Thus, growth of crystal with a large size can be suppressed, and generation of a leakage current through a crystallized portion can be reduced.

Figure 6:
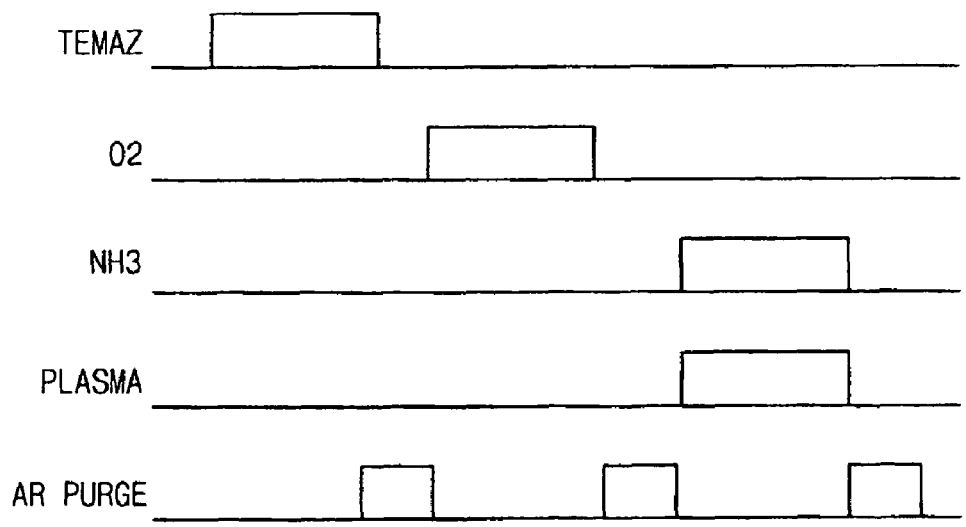

The diagram of FIG. 6 illustrates exemplary sequences of providing reactive gases in a method of forming the zirconium carbo-oxynitride layer through an atomic-layer-deposition process. As illustrated in FIG. 6, the zirconium carbo-oxynitride layer can be formed by sequentially and repeatedly providing a second zirconium source (e.g., TEMAZ), a purging gas (e.g., Ar), a second oxidizing gas (e.g., $O_2$), a purging gas (e.g., Ar), a nitriding gas (e.g., $NH_3$) and a purging gas (e.g., Ar). After or while the nitriding gas is provided, plasma can also be provided.

After forming the zirconium carbo-oxynitride layer on the first zirconium carbo-oxynitride layer, a second zirconium oxide layer can be formed on the zirconium carbo-oxynitride layer under a weak oxidation atmosphere (S30). The formation of the second zirconium oxide layer can optionally be performed to improve the dielectric constant per unit thickness.

Figure 4:
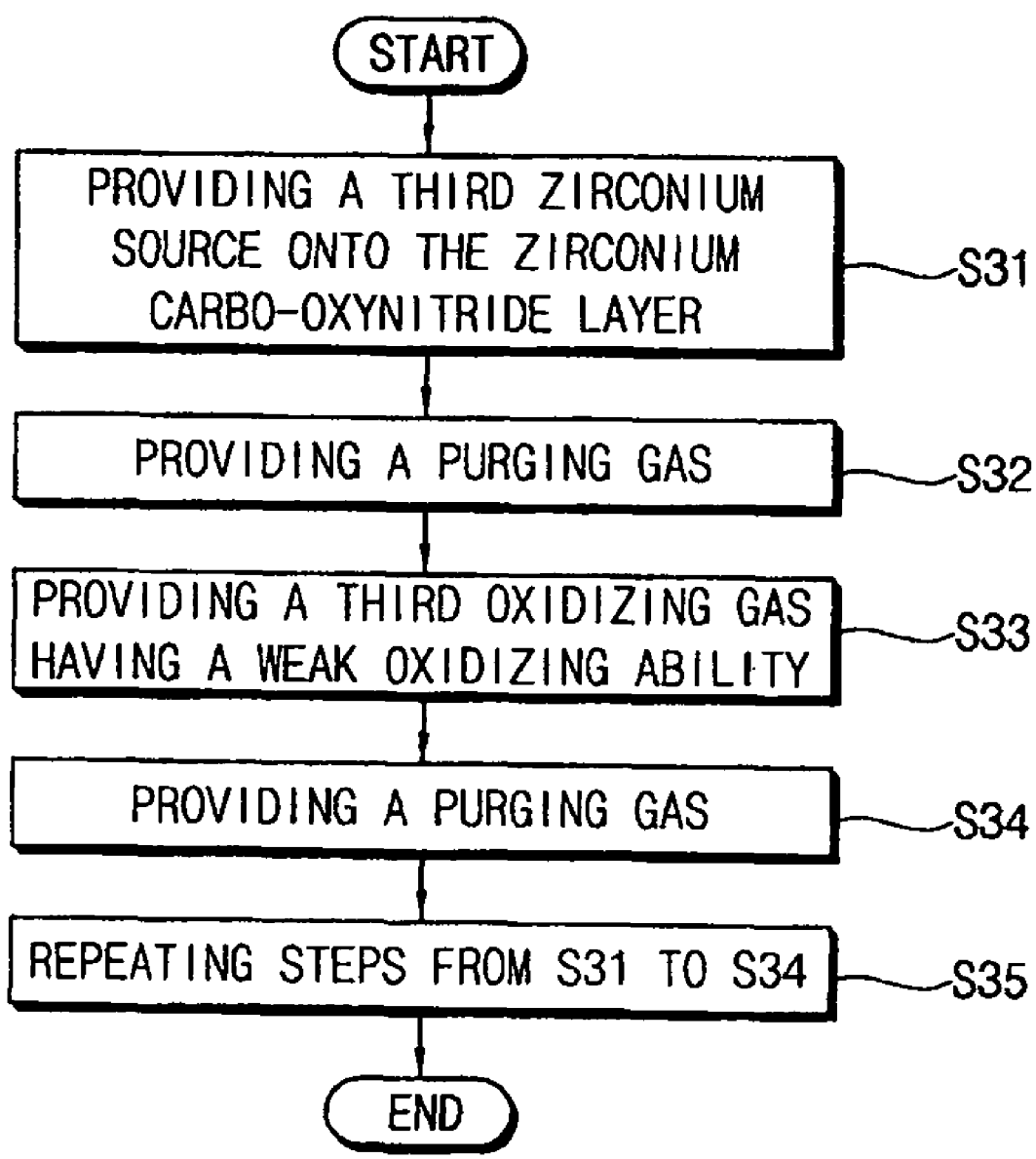

The flow chart of FIG. 4 illustrates a method of forming the second zirconium oxide layer on the zirconium carbo-oxynitride layer according to example embodiments. Referring to FIG. 4, a third zirconium source can be supplied to the zirconium carbo-oxynitride layer in a chamber (S31), and the third zirconium source can be adsorbed onto the zirconium carbo-oxynitride layer to form an adsorption layer of the third zirconium source. The third zirconium source can be the same as or different from the first and the second zirconium sources; for example, the third zirconium source can be tetrakis(dialkylamino)zirconium (TEMAZ). A purging process can be performed to remove a non-adsorbed portion of the third zirconium source from the semiconductor substrate (S32).

A third oxidizing gas can be supplied to the zirconium carbo-oxynitride layer (S33). The third oxidizing gas can be a reactive gas to oxidize the third zirconium source of the adsorption layer, and the third oxidizing gas can have a relatively weak oxidizing ability to reduce or suppress an additional oxidation of the underlying zirconium carbo-oxynitride layer. Non-limiting examples of the third oxidizing gas can include oxygen ($O_2$), ozone ($O_3$), water vapor ($H_2O$) and the like.

In example embodiments, the reaction of the third zirconium source and the third oxidizing gas may not be activated by plasma. For example, a weak oxidizing gas (e.g., water vapor) can be used without plasma activation to oxidize the third zirconium source and to suppress the oxidation of the zirconium carbo-oxynitride layer. In other example embodiments, the reaction of the third zirconium source and the third oxidizing gas can be activated by plasma with a sufficiently low energy to reduce or suppress oxidization of the zirconium carbo-oxynitride layer; the plasma can be provided at a relatively low power and/or for a relatively short time.

A purging process can be performed to remove a non-reacted portion of the second oxidizing gas from the semiconductor substrate and from the chamber (S34). The above steps from S31 to S34 can be repeatedly performed, in a repeating cycle, to obtain a predetermined thickness of the second zirconium oxide layer. For example, the second zirconium oxide layer can be formed by repeating the cycle about 10 to about 50 times to produce a thickness of about 10-50 Å.

As mentioned above, a dielectric layer of zirconium-oxide-based multi-layer composites can be formed on a substrate. The dielectric layer can suppress or reduce generation of a leakage current and can have a high dielectric constant. Therefore, the dielectric layer can be properly employed in manufacturing a highly integrated device.

Figure 7:
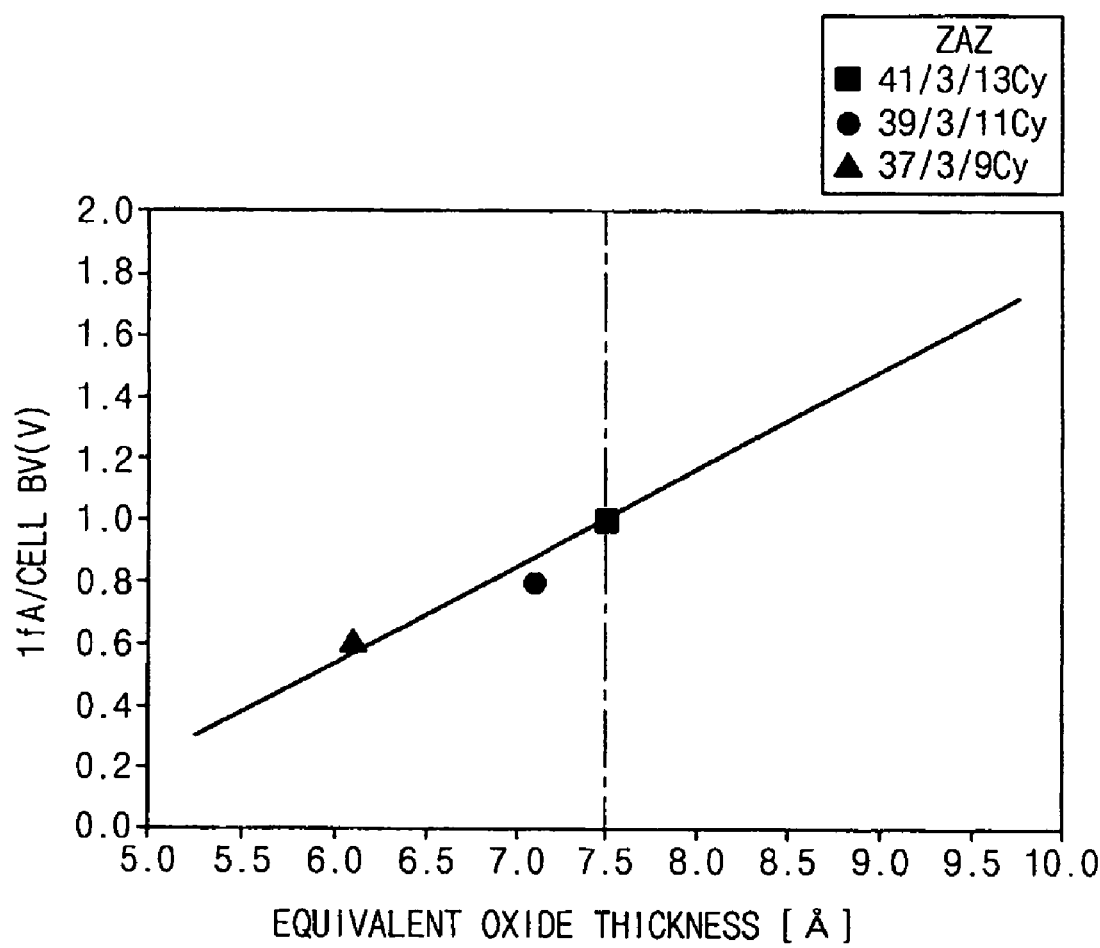

The graph of FIG. 7 illustrates a relation of an equivalent oxide thickness (EOT) and a breakdown voltage (BV) to induce 1 fA/cell in a dielectric layer of zirconium oxide/aluminum oxide/zirconium oxide ($ZrO_2/Al_2O_3/ZrO_2$, ZAZ). Referring to FIG. 7, a dielectric layer of zirconium oxide/aluminum oxide/zirconium oxide (ZAZ), which can be employed in a metal-insulator-metal (MIM) capacitor of a dynamic random access memory (DRAM) device, can have an equivalent-oxide-thickness (EOT) limit of about 7.5 Å at 1 fA/cell-BV of about ±1V. However, such an EOT value of the ZAZ dielectric layer can restrict further scaling down of a device in accordance with a decrease in a design rule or a critical dimension of a device.

A dielectric layer having an intervening zirconium carbo-oxynitride film instead of an aluminum oxide film can present a higher dielectric constant and/or a thinner EOT in comparison with the ZAZ layer. The intervening zirconium carbo-oxynitride film can, however, be readily deteriorated while a zirconium oxide film is formed on the zirconium carbo-oxynitride film.

Figure 8:
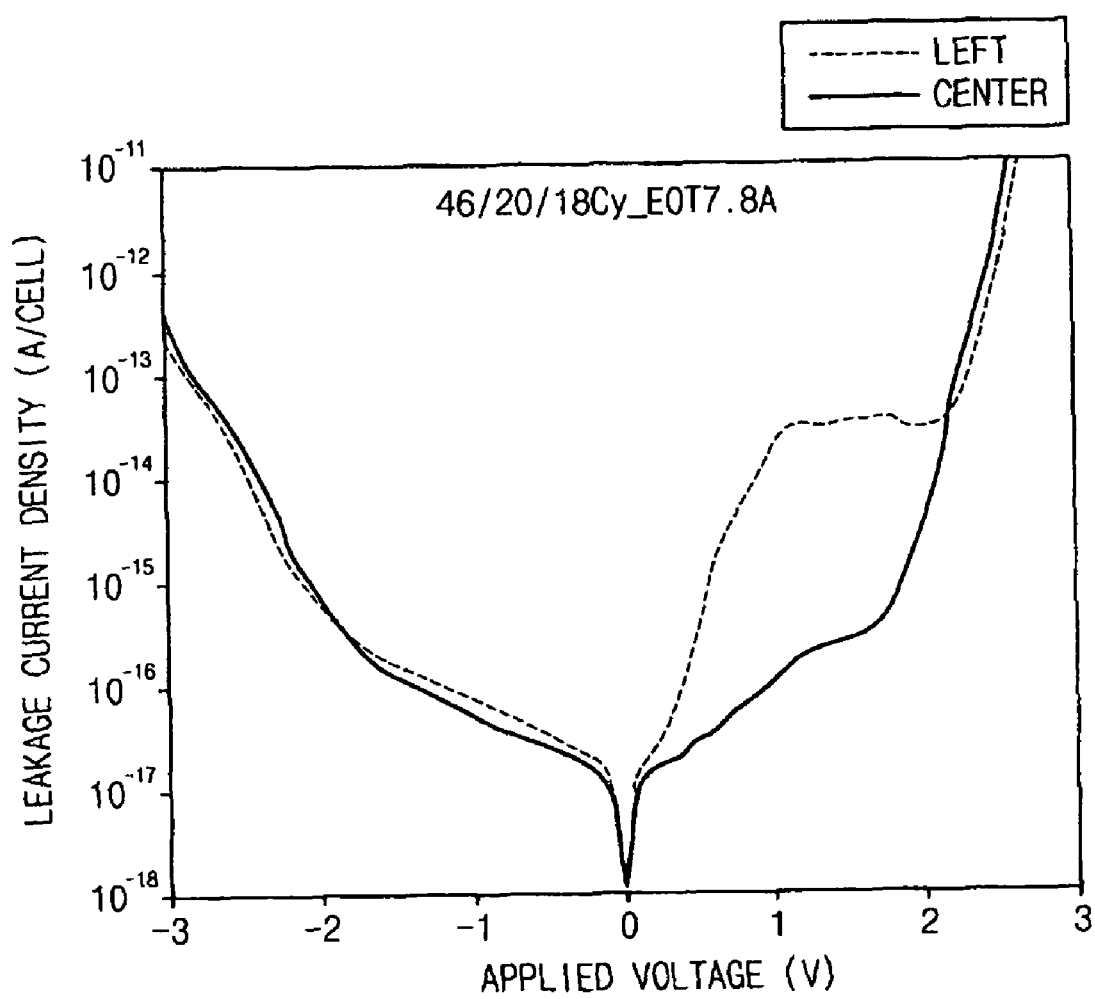

As an example, the graph of FIG. 8 illustrates a leakage current density (A/cell) vs. applied voltage (V) measured from a capacitor having a dielectric layer of zirconium oxide/zirconium carbo-oxynitride/zirconium oxide ($ZrO_2/ZrOCN/ZrO_2$, ZNZ). After forming a zirconium carbo-oxynitride film on a first zirconium oxide film, a second zirconium oxide film was formed using $O_2$ activated by plasma. Leakage current characteristics were measured after thermally treating the dielectric layer at a temperature of about 450° C. under $N_2$ for about 15 minutes. The dielectric layer was measured to have an equivalent oxide thickness (EOT) of about 7.8 Å.

As illustrated in FIG. 8, a leakage current was largely generated in a zirconium oxide/zirconium carbo-oxynitride/zirconium oxide layer at several position points of a wafer. According to microscopic observation, generation of a leakage current through a dielectric layer of zirconium oxide/zirconium carbo-oxynitride/zirconium oxide increased as the amount of plasma-activated $O_2$ supplied to the zirconium carbo-oxynitride film increased and as the thickness of the second zirconium oxide film increased.

A zirconium oxide layer having a relatively large thickness can be readily crystallized during a subsequent thermal process; and, thus, a leakage current through a crystallized portion may occur. As the zirconium carbo-oxynitride film may be excessively oxidized by the oxidizing agent used in forming a zirconium oxide film thereon, the zirconium carbo-oxynitride film may not effectively suppress crystallization of the zirconium oxide film.

Figure 9A:
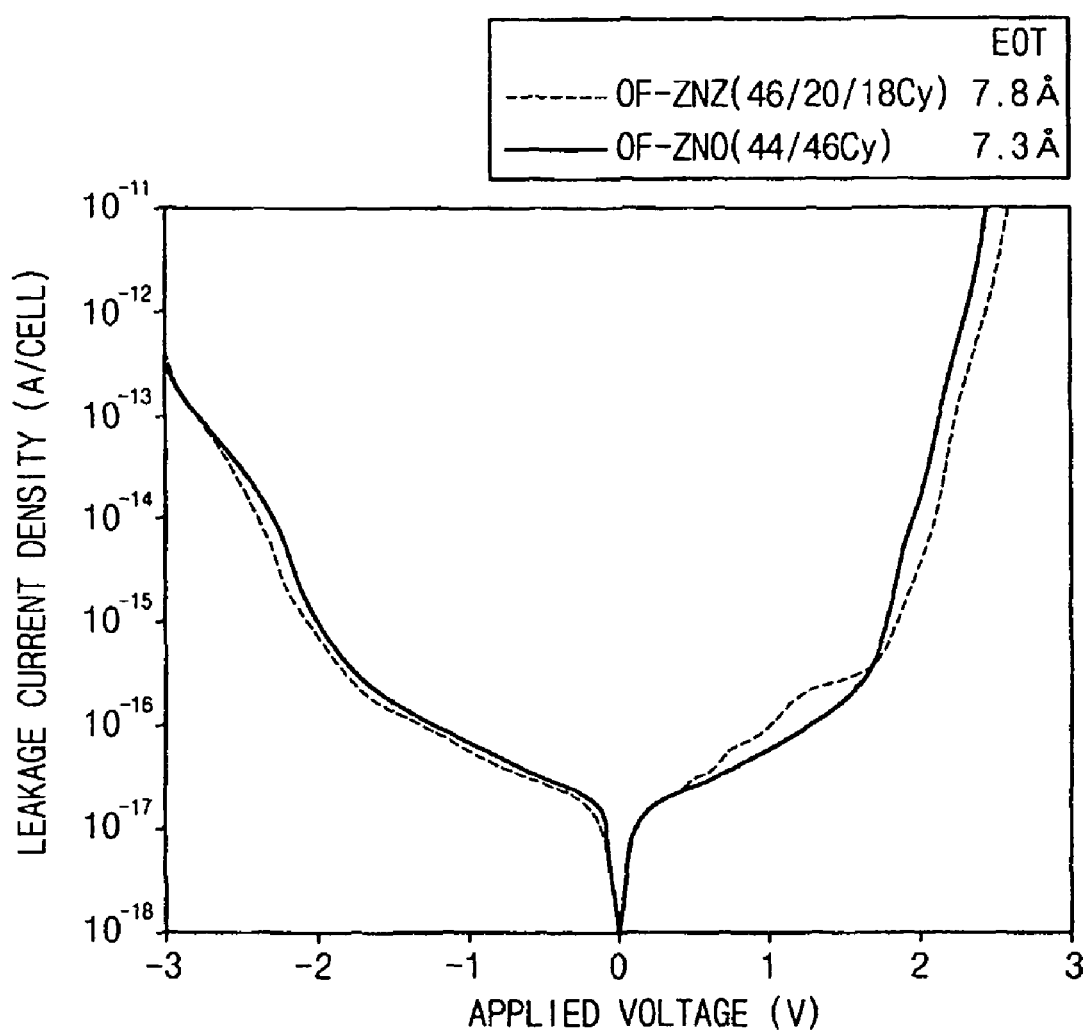
FIGS. 9A through 9C are graphs illustrating a leakage current density (A/cell) vs. applied voltage (V) measured from capacitors that had a dielectric layer.
Figure 9B:
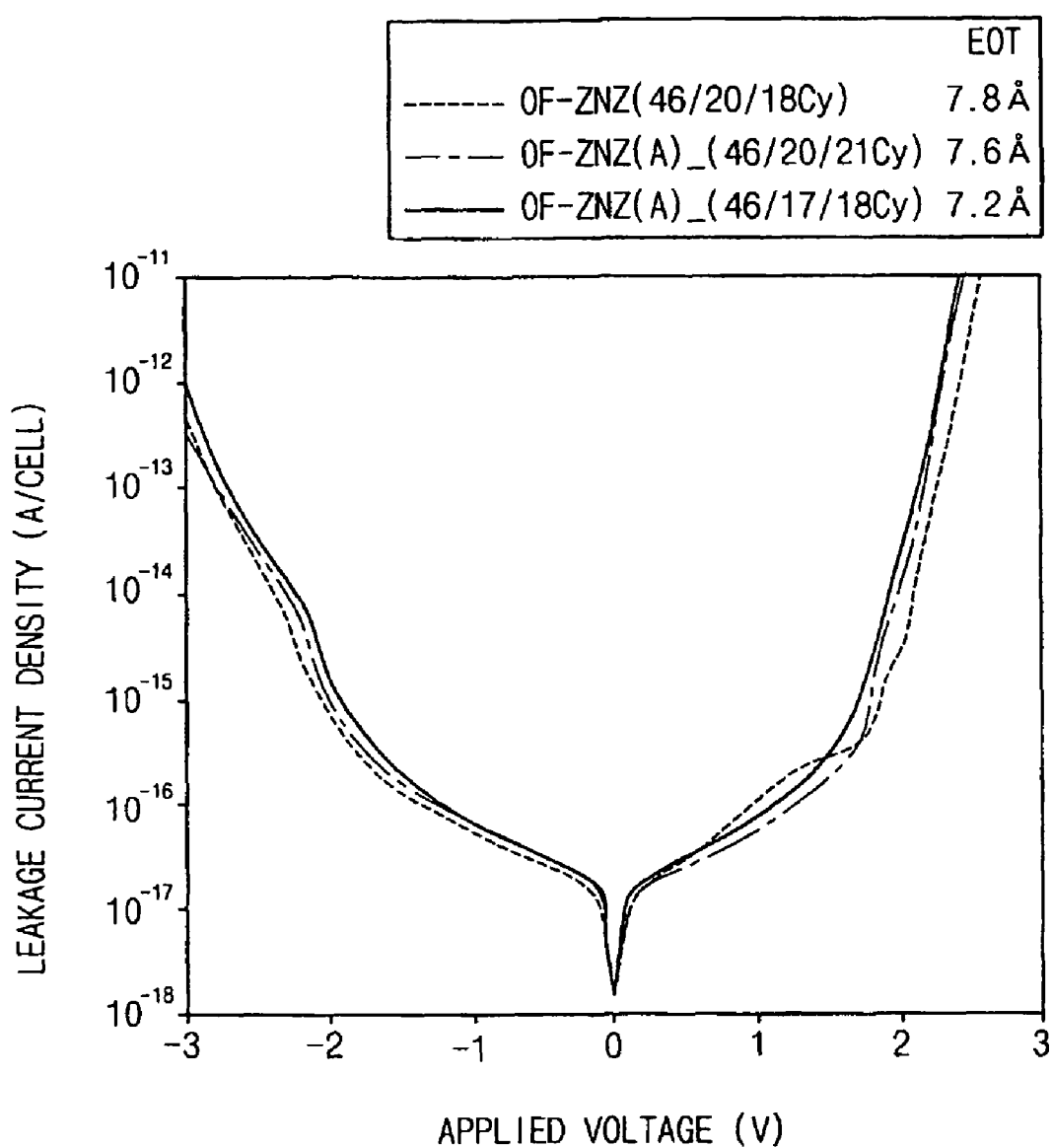
Figure 9C:
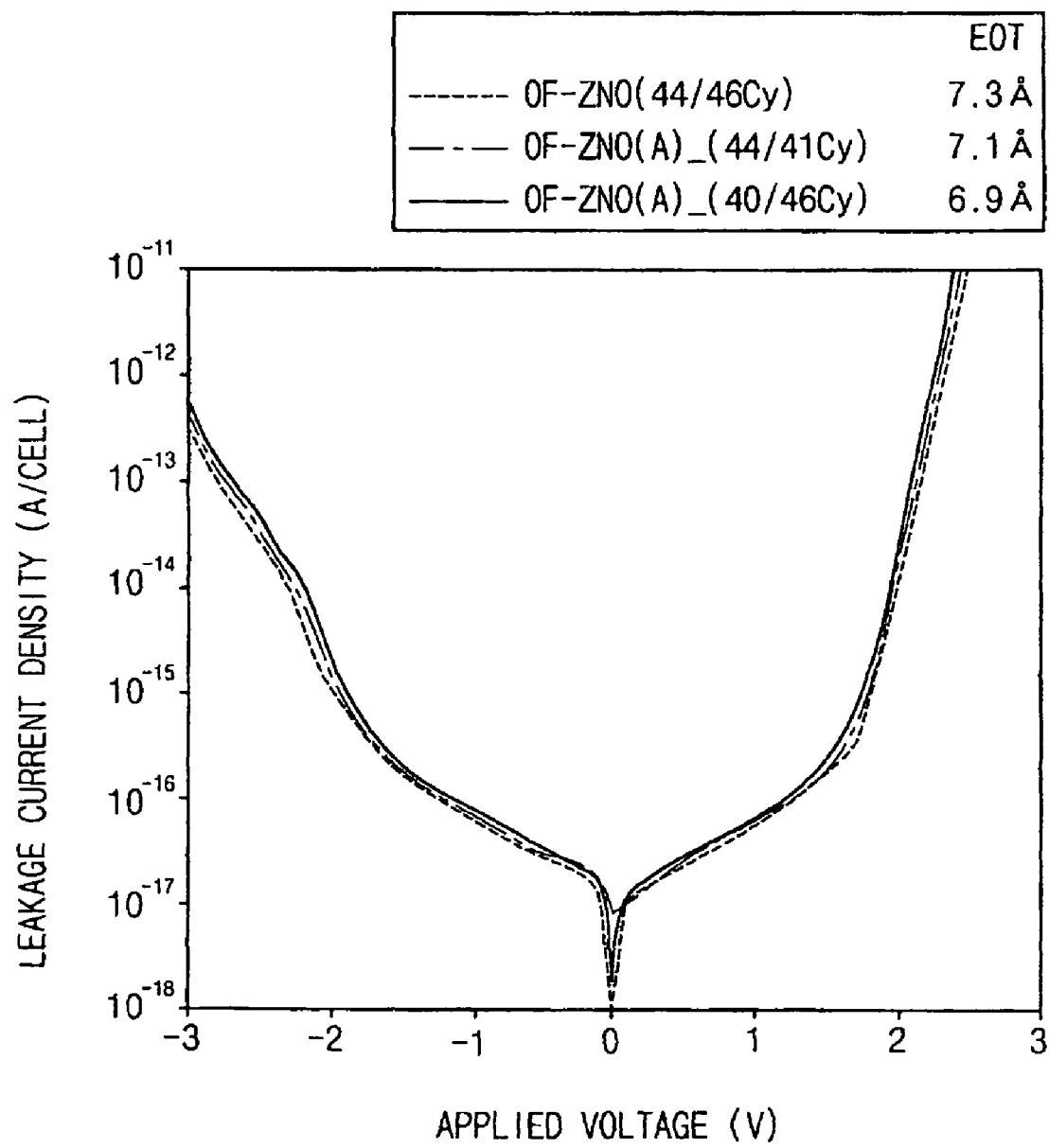

The graphs of FIGS. 9A through 9C illustrate a leakage current density (A/cell) vs. applied voltage (V) measured from capacitors having a dielectric layer. The solid line of FIG. 9A and the graphs of FIG. 9B illustrate a leakage current density of a dielectric layer of zirconium oxide/zirconium carbo-oxynitride/zirconium oxide ($ZrO_2/ZrOCN/ZrO_2$, ZNZ) formed by example embodiments. The dashed line of FIG. 9A and the graphs of FIG. 9C illustrate a leakage current density of the dielectric layer of zirconium oxide/zirconium carbo-oxynitride ($ZrO_2/ZrOCN$, ZNO) formed by example embodiments. A first zirconium oxide film of the ZNZ dielectric layer was formed by an atomic-layer-deposition process using oxygen gas with plasma activation (plasma $O_2$); and a second zirconium oxide film of the ZNZ dielectric layer was formed under a decreased oxidizing atmosphere, e.g., using water ($H_2O$) vapor without plasma activation. Leakage current characteristics were measured after thermally treating the dielectric layer at a temperature of about 450° C. under $N_2$ for about 15 minutes. In FIGS. 9A through 9C, the numbers in the parentheses indicate the numbers of cycles (Cy) in the atomic-layer-deposition process.

Referring to FIG. 9A, the ZNZ dielectric layer formed using a weak oxidant. The ZNZ dielectric layer was measured to have an equivalent oxide thickness (EOT) of about 7.8 Å, and it showed a leakage current density of about 1 fA/cell (femto ampere/cell) when a voltage of about −1.9V/1.7V was applied. Therefore, it can be noted that leakage current characteristics of the ZNZ dielectric layer can be improved by forming the second zirconium oxide film on the zirconium carbo-oxynitride under a weak oxidizing atmosphere. The ZNO dielectric layer was measured to have an EOT of about 7.3 Å and showed a leakage current density of about 1 fA/cell (femto ampere/cell) when a voltage of about −1.9V/1.8V was applied. Accordingly, it can be noted that the ZNO dielectric layer can also improve leakage current characteristics of a device, such as the ZNZ dielectric layer.

Referring to FIG. 9B, the EOT of the ZNZ dielectric layer varied from about 7.8 Å to 7.2 Å by changing the number of cycles in the atomic-layer-deposition process and the thickness of each sub-layer. It can be noted that the EOT of the ZNZ dielectric layer may decrease as the number of cycles for forming the zirconium carbo-oxynitride layer and/or as the number of cycles for forming the second zirconium oxide layer becomes smaller. Further, even though the ZNZ dielectric layer has an EOT of about 7.2 Å, which is thinner than the EOT of about 7.5 Å for the ZAZ layer, deterioration of leakage current characteristics was not observed.

Referring to FIG. 9C, the EOT of the ZNO dielectric layer varied from about 7.3 Å to 6.9 Å by changing the number of cycles in the atomic-layer-deposition process and the thickness of each sub-layer. Further, even though the ZNO dielectric layer has an EOT of about 6.9 to about 7.3 Å, which is thinner than the EOT of about 7.5 Å for the ZAZ layer, the deterioration of leakage current characteristics was not observed.

Methods of Manufacturing a Semiconductor Device

The cross-sectional views of FIGS. 10 through 17B illustrate a method of manufacturing a dynamic random access memory (DRAM) device according to example embodiments.

Figure 10:
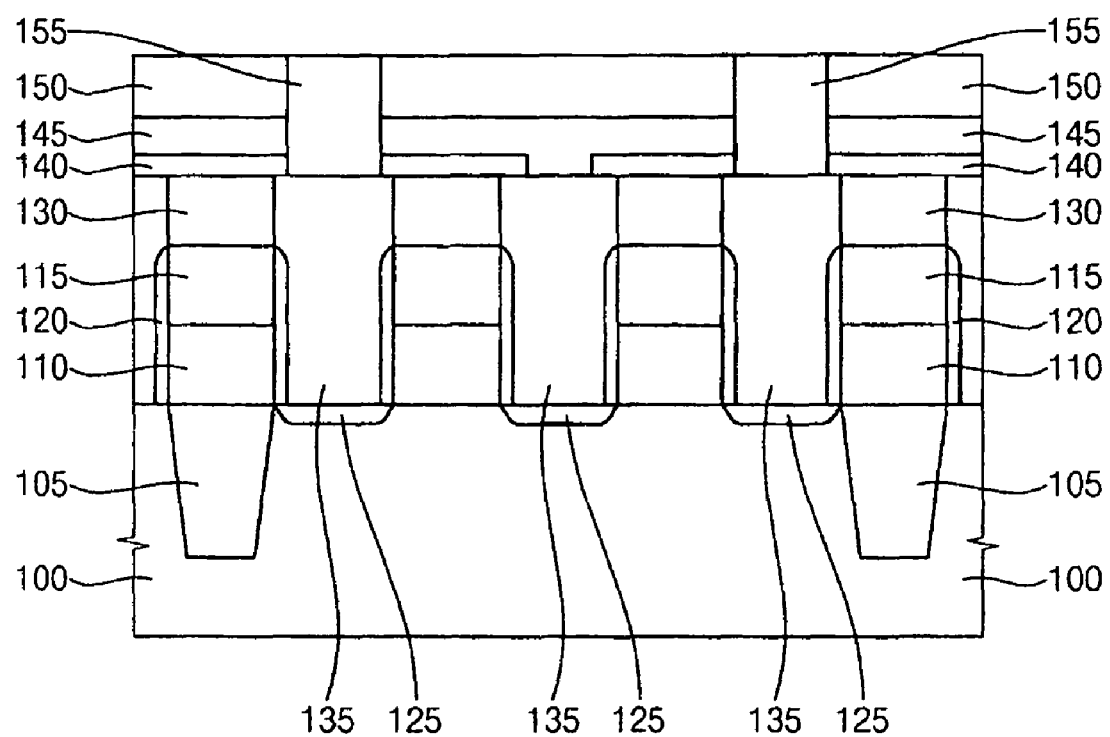

Referring to FIG. 10, an isolation layer 105 can be formed on a semiconductor substrate 100. A gate electrode structure including a gate dielectric layer (not illustrated), a gate conductive layer 110, a gate mask 115 and a gate spacer 120 can be formed on the semiconductor substrate 100. The gate dielectric layer can be formed by using the methods of forming a dielectric layer according to the example embodiments. Impurity regions 125 can be formed at the semiconductor substrate 100 adjacent to the gate electrode structure, and a first insulating interlayer 130 can be formed on the semiconductor substrate to cover the gate electrode structure. After forming a first contact hole (not illustrated) through the first insulating interlayer 130 to expose the impurity regions 125, a first contact plug 135 can be formed in the first contact hole using a conductive material.

A second insulating interlayer 140 can be formed on the first contact plug 135 and on the first insulating interlayer 130, and then a bit line 145 can be formed on the second insulating interlayer 140. A bit line contact (not illustrated) can be formed through the second insulating interlayer 140 to connect the bit line 145 to the first contact plug 135. A third insulating interlayer 150 can be formed on the second insulating interlayer 140 to cover the bit line 145. After forming a second contact hole (not illustrated) through the second and the third insulating interlayers 140 and 150 to expose the first contact plug 135, a second contact plug 155 can be formed in the second contact hole using a conductive material.

Figure 11:
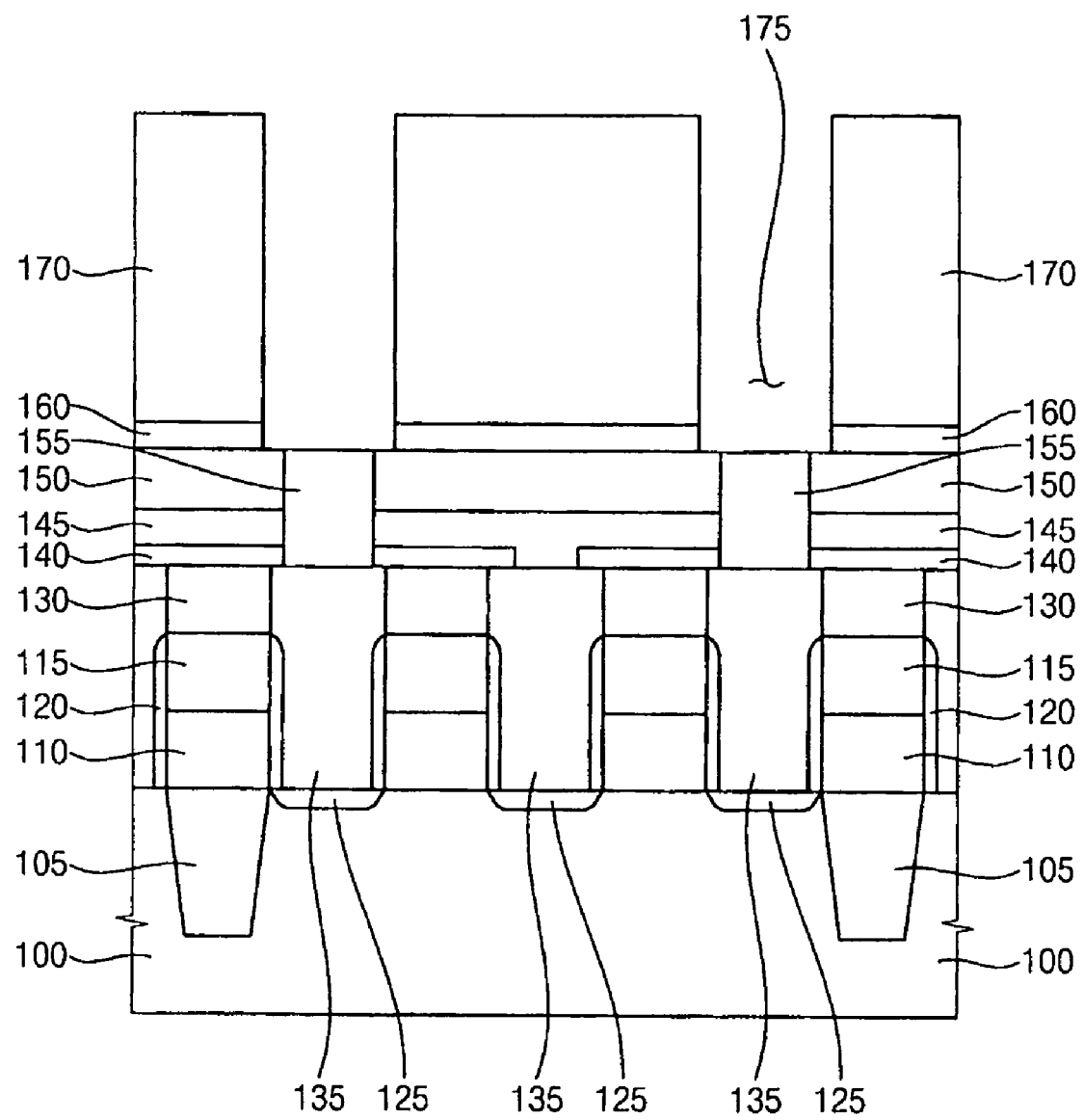

Referring to FIG. 11, an etch stop layer 160 can be formed on the third insulating interlayer 150 and on the second contact plug 155 by performing a chemical vapor deposition (CVD) process using silicon nitride. A mold layer 170 can be formed on the etch stop layer 160. The mold layer 170 can have a predetermined thickness that is a function of the surface area of the capacitor; for example, the mold layer 170 can be formed to a thickness of about 10,000 Å to about 20,000 Å. Additionally, the mold layer 170 can be formed to have a single layer or a plurality of sub-layers that can have different etch rates. A plurality of holes 175 for a capacitor electrode can be formed in the mold layer 170 by performing a photolithography process. Forming the plurality of holes 175 exposes the second contact plug 155 by removing a portion of the etch stop layer 160.

Figure 12:
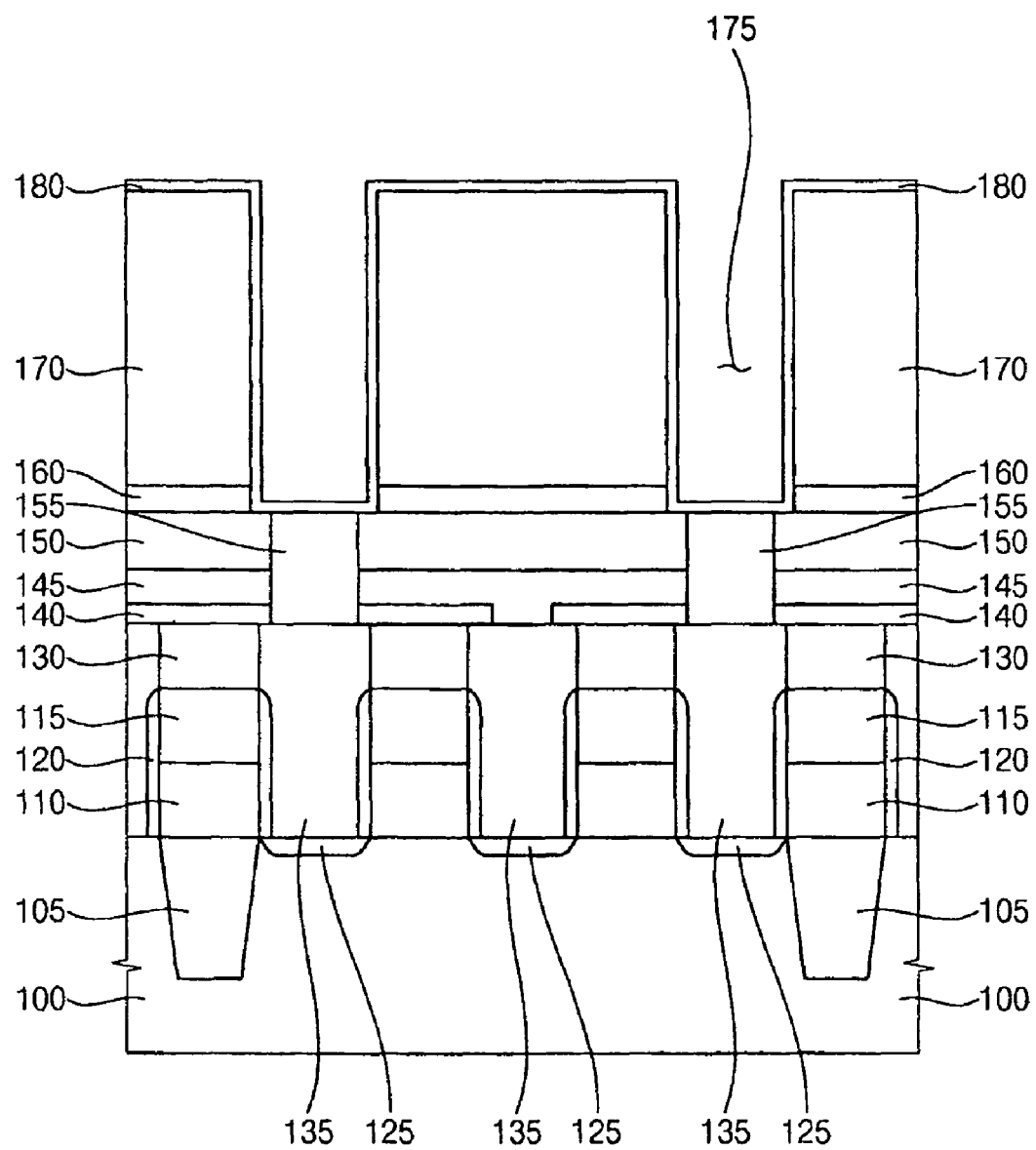

Referring to FIG. 12, a lower electrode layer 180 can be formed on the mold layer 170 having the plurality of holes 175; the lower electrode layer 180 can be formed of a conductive material (e.g., TiN, Ti, TaN, Pt, etc.). The lower electrode layer 180 can be contacted with the second contact plug 155, and the lower electrode layer 180 can be supported by the etch stop layer 160 having a sufficient thickness after the mold layer 170 is removed in a subsequent process.

Figure 13:
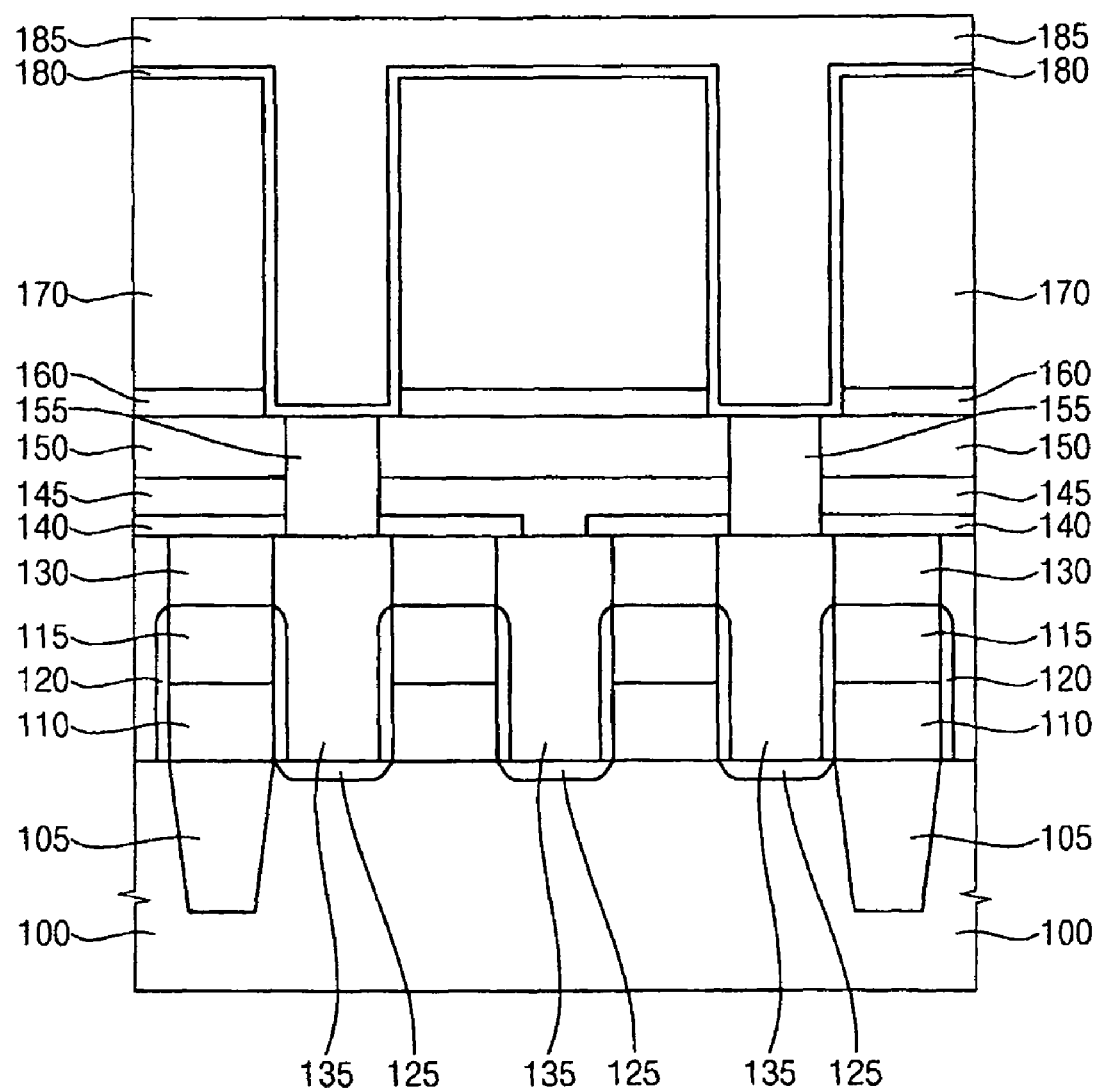

Referring to FIG. 13, a buffer layer 185 can be formed on the lower electrode 170 to fill the holes 175. The buffer layer 185 can be formed of an insulation material that is substantially the same as or different from the material of which the mold layer 170 is formed. When the buffer layer 185 and the mold layer 170 are formed of the same material, the buffer layer 185 and the mold layer 170 can be simply removed by the same removal process after forming a lower electrode; but, in such a case, the lower electrode can readily fall down. Forming the buffer layer 185 and the mold layer 170 using different materials can reduce generation of a defect. For example, the buffer layer 185 can be formed of a photosensitive material that can be different from an insulation material of the mold layer 170.

Figure 14:
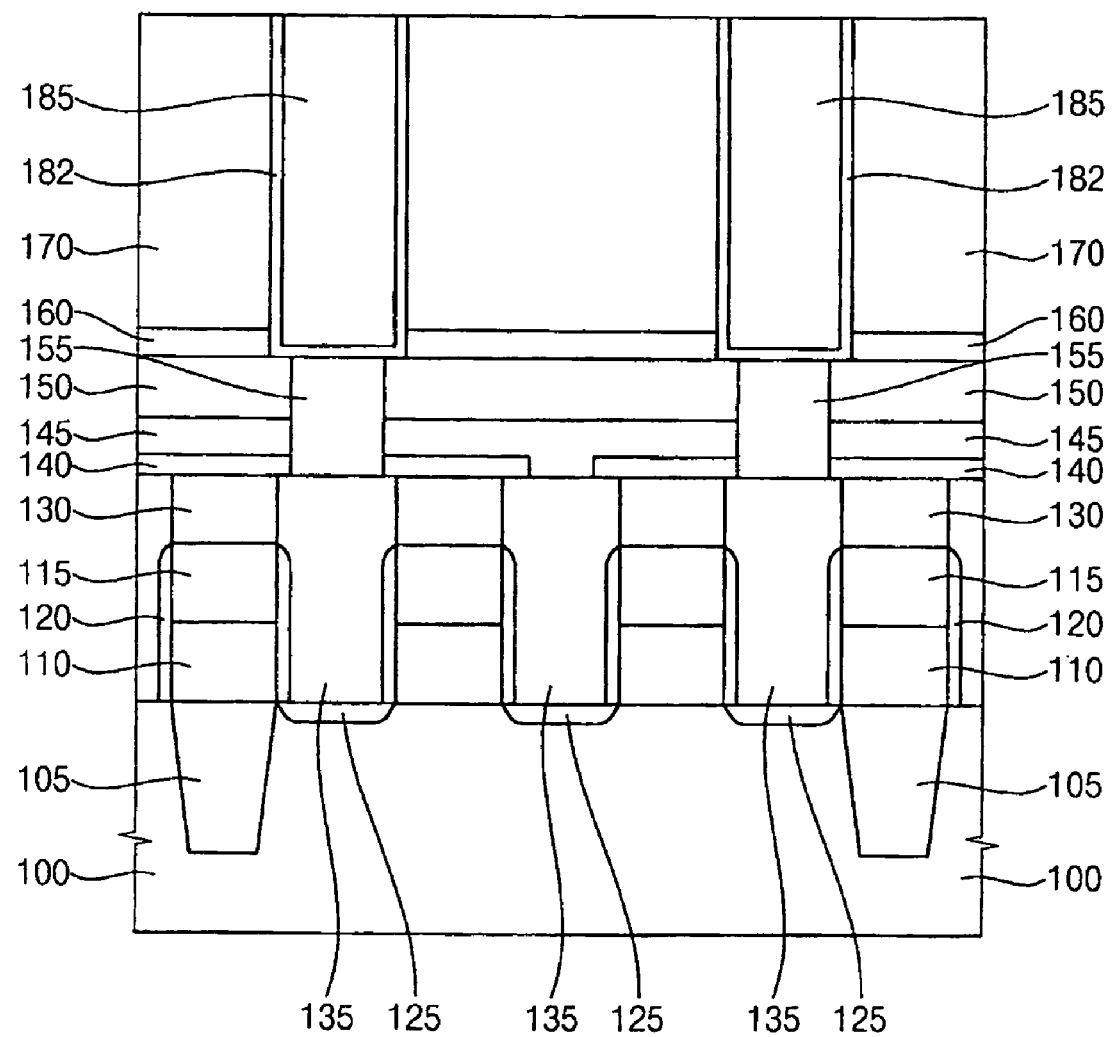

Referring to FIG. 14, upper portions of the buffer layer 185, the mold layer 170 and the lower electrode layer 180 can be removed by an etch-back process to form a lower electrode 182 that is isolated by the mold layer 170. A top portion of the lower electrode 182 can be formed to have a round shape by performing a wet-etching process on the mold layer 170 and on the top portion of the lower electrode 180. When the top portion of the lower electrode 182 is sharp, a dielectric layer of a capacitor can be broken, or a leakage current from the top portion of the lower electrode 182 can be generated.

Figure 15:
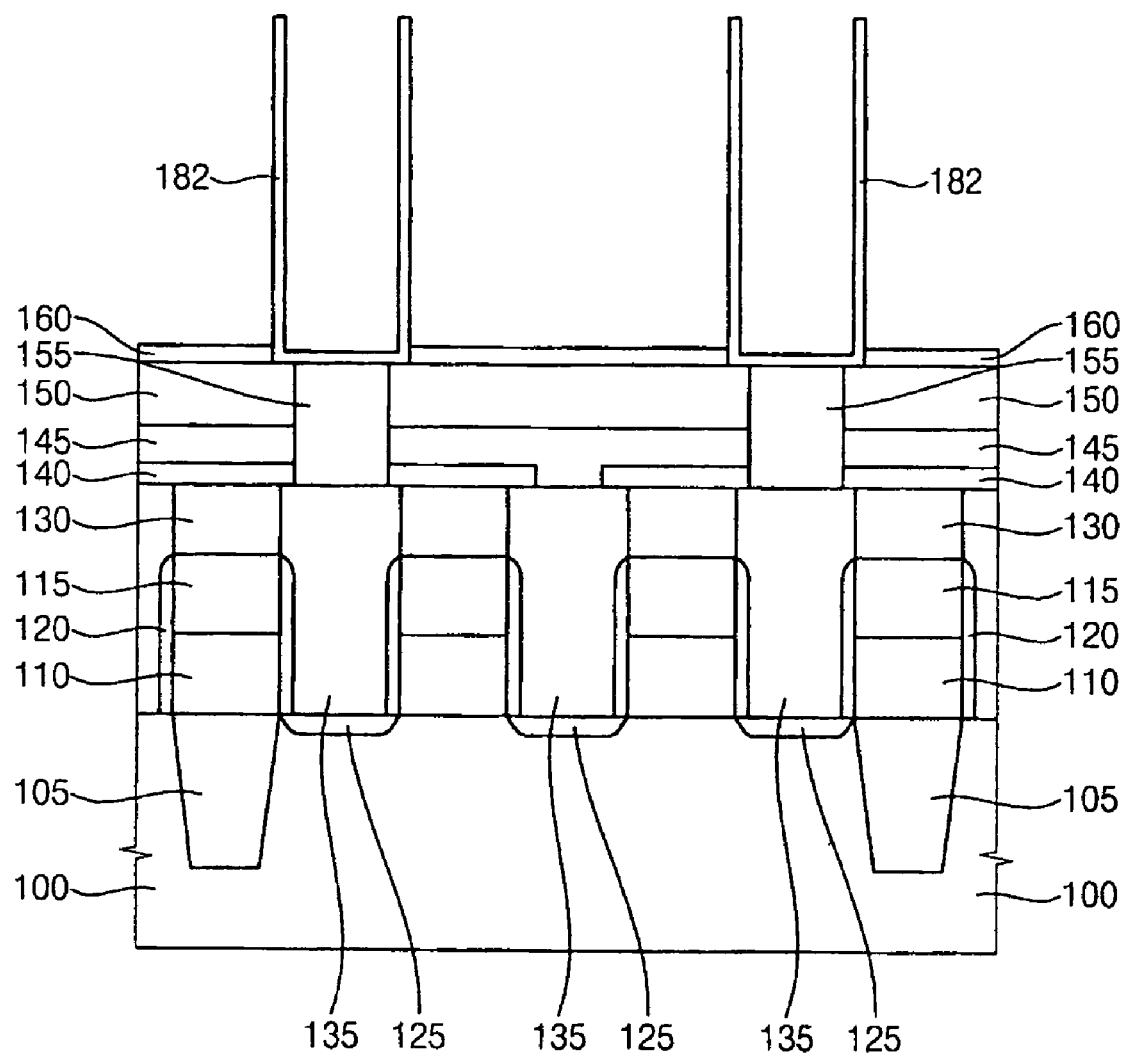

Referring to FIG. 15, the buffer layer 185 and the mold layer 170 can be removed from the semiconductor substrate 100. For example, the buffer layer 185 and the mold layer 170 can be removed by a lift-off process using a limulus amoebocyte lysate (LAL) solution that can include deionized water, ammonium hydrofluoride and hydrofluoric acid. Removing the buffer layer 185 and the mold layer 170 can be carefully performed such that adjacent lower electrodes 182 do not contact each other or fall down. Although not illustrated in the drawings, an additional structure for supporting the lower electrode 182 can be formed to prevent adjacent lower electrodes 182 from contacting each other or falling down; the supporting structure can have, e.g., a ladder shape or a ring shape and can be formed around the lower electrode 182.

Figure 16A:
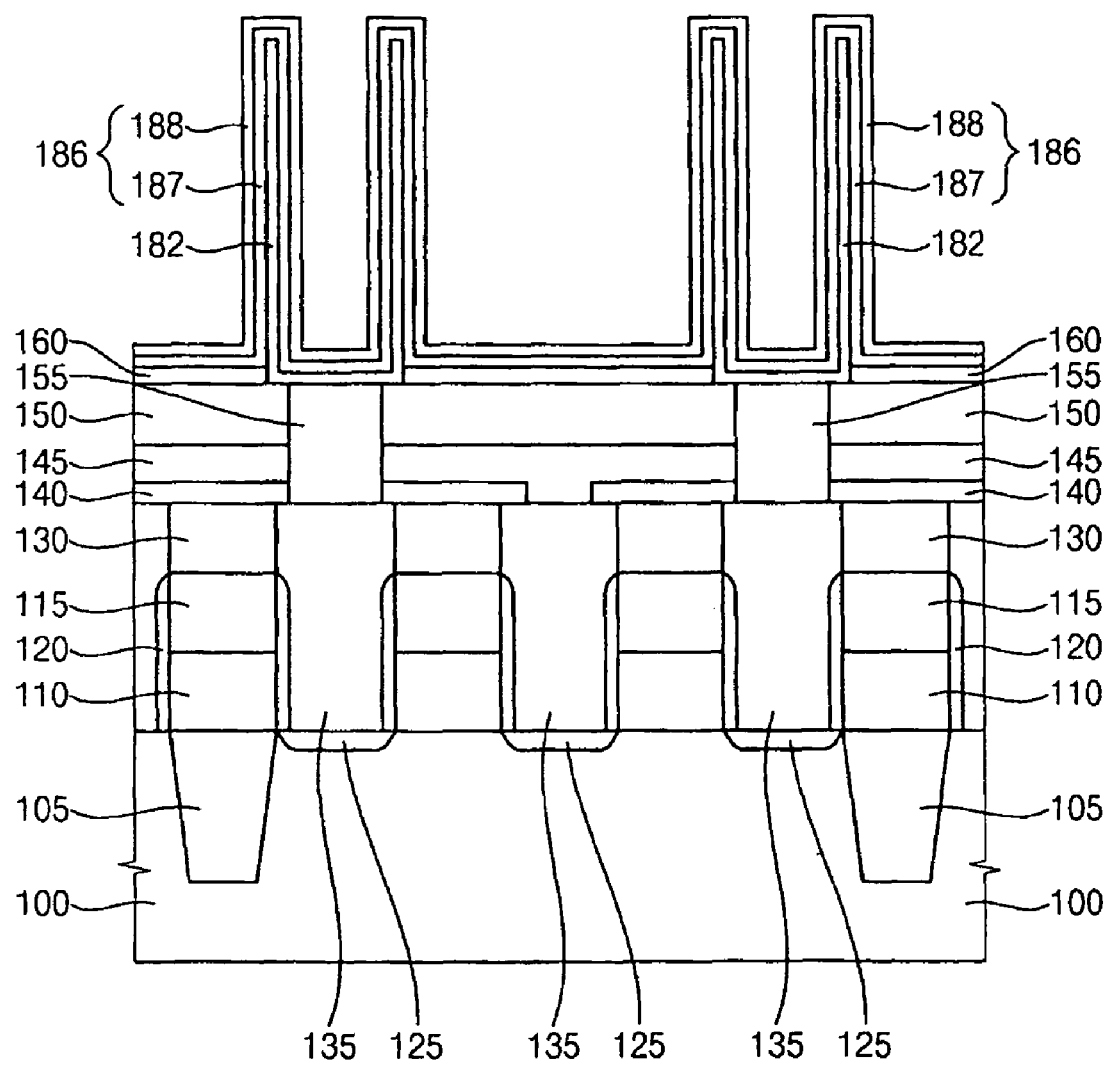
Figure 16B:
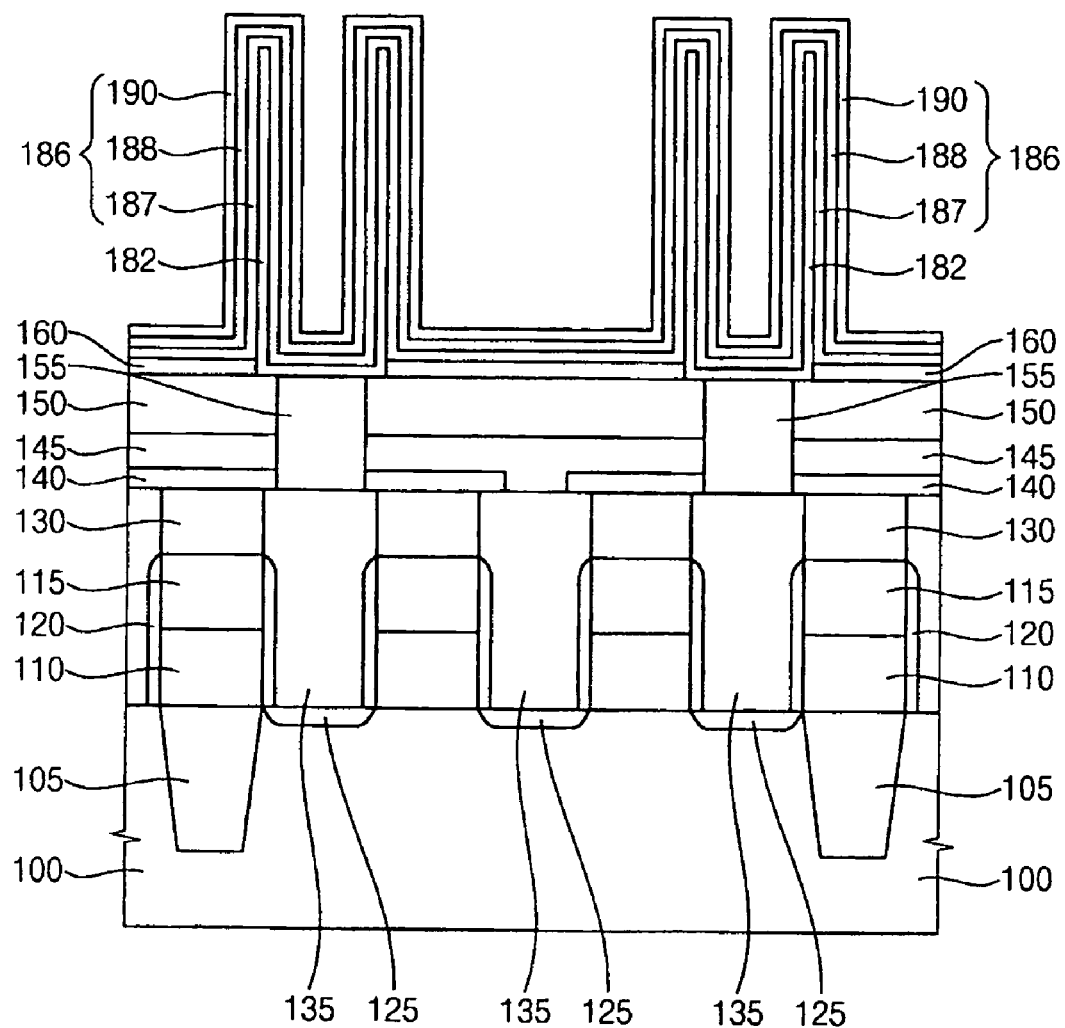

Referring to FIGS. 16A and 16B, a dielectric layer 186 can be formed on the lower electrode 182. The dielectric layer 186 can be formed by the above-mentioned methods of forming a dielectric layer of zirconium-oxide-based multi-layer composites according to example embodiments. In some example embodiments, the dielectric layer 186 can be formed to have a first zirconium oxide film 187 and a zirconium carbo-oxynitride film 188, as illustrated in FIG. 16A. In other example embodiments, the dielectric layer 186 can be formed to have a first zirconium oxide film 187, a zirconium carbo-oxynitride film 188 and a second zirconium oxide film 190, as illustrated in FIG. 16B.

For example, the semiconductor substrate on which the lower electrode 182 and other structure are formed is loaded in a reaction chamber for an atomic-layer-deposition process. A first zirconium source (e.g., TEMAZ) can be provided in the chamber to form a chemical adsorption layer of the first zirconium source on the lower electrode 182. After purging the chamber using an inactive gas (e.g., Ar, He or $N_2$) to remove a non-adsorbed portion of the first zirconium source, a first oxidizing gas (e.g., $O_2$, $O_3$ or $H_2O$) can be injected into the chamber to oxidize the chemical adsorption layer of the first zirconium source. As a result, an atomic layer of a first zirconium oxide layer 187 can be formed on the lower electrode 182. The reaction of the first zirconium source and the first oxidizing gas can be activated by plasma. Plasma can be provided in the reaction chamber while or after the first oxidizing gas is provided. A purging gas (e.g., Ar, He or $N_2$) can be injected into the chamber to remove any remaining first oxidizing gas from the chamber. By repeating this sequence, a first zirconium oxide layer 187 having a predetermined thickness can be obtained.

After forming the first zirconium oxide layer 187 on the lower electrode 182, the zirconium carbo-oxynitride layer 188 can be formed on the first zirconium oxide layer 187. The zirconium carbo-oxynitride layer 188 can be formed by an in-situ process with the formation of the first zirconium oxide layer 187 using the same atomic-layer-deposition apparatus. That is, a second zirconium source used for forming the zirconium carbo-oxynitride layer 188 can be provided directly after purging the chamber to remove a non-reacted first oxidizing gas.

For example, a second zirconium source (e.g., TEMAZ) can be provided in the chamber to form a chemical adsorption layer of the second zirconium source on the first zirconium oxide layer 187. After purging the chamber using an inactive gas (e.g., Ar, He or $N_2$) to remove a non-adsorbed portion of the second zirconium source, an oxidizing gas (e.g., $O_2$, $O_3$ or $H_2O$) can be injected into the chamber to oxidize the chemical adsorption layer of the second zirconium source. The oxidized adsorption layer of the zirconium source can have a reduced amount of carbon and nitrogen relative to the zirconium source. The oxidizing gas can partially take part in the reaction with the adsorption layer of the second zirconium source. The rate of the chemical reaction between the second zirconium source and the second oxidizing gas can depend on the pressure and/or the temperature, and the reaction degree can also vary depending on the oxidizing ability of the oxidizing gas. Thus, the pressure, the temperature and/or the type of the oxidizing gas can be properly adjusted such that the zirconium carbo-oxynitride layer 188 can be formed to have predetermined amounts of carbon and nitrogen.

A purging gas (e.g., Ar, He or $N_2$) can be injected into the chamber to remove any remaining oxidizing gas from the chamber. After purging the chamber, a nitriding gas can be injected into the chamber. Examples of the nitriding gas can include NO, $NO_2$, $NH_3$, etc. While the nitriding gas is provided, plasma can also be provided in the chamber. The oxidized adsorption layer of the zirconium source can be nitrided by the nitriding gas and plasma, and binding forces between zirconium, oxygen, carbon and nitrogen can increase to form a zirconium carbo-oxynitride layer 188 having improved stability. When the amount of nitrogen included in the zirconium carbo-oxynitride layer 188 is excessive, electrical characteristics (e.g., dielectric constant, equivalent oxide thickness or leakage current) can be deteriorated. Thus, the amount of the nitriding gas that is provided can be limited. After providing the nitriding gas, a purging gas can be injected into the chamber to remove a non-reacted portion of the nitriding gas. The zirconium carbo-oxynitride layer 188 thus formed can have a formula of $ZrO_{2-x-y}C_xN_y$. A basic atomic layer can be formed on the lower electrode layer 182 by performing one cycle of atomic layer deposition. The zirconium carbo-oxynitride layer 188 can be formed to a predetermined thickness by repeating a plurality of the cycles.

As illustrated in FIG. 16B, the dielectric layer 186 can be formed to further include a second zirconium oxide layer 190 on the zirconium carbo-oxynitride layer 188. Formation of the second zirconium oxide layer 190 can be performed by an in-situ process using the same atomic-layer-deposition apparatus with the formations of the first zirconium oxide layer 187 and/or the zirconium carbo-oxynitride layer 188. That is, a third zirconium source used for forming the second zirconium oxide layer 190 can be supplied directly after purging the chamber to remove a non-reacted nitriding gas used in forming the zirconium carbo-oxynitride layer 188. For example, the second zirconium oxide layer 190 can be formed by sequentially and repeatedly supplying the third zirconium source (e.g., TEMAZ), a purging gas (e.g., Ar, He or $N_2$), a third oxidizing gas (e.g., $O_2$, $O_3$ or $H_2O$) and a purging gas. The third oxidizing gas can have a relatively weak oxidizing ability to thereby suppress oxidation of the zirconium carbo-oxynitride layer 188. One or more of the following factors can be adjusted to reduce loss of carbon and/or nitrogen in the zirconium carbo-oxynitride layer 188: the type of the third oxidizing gas, feeding time and/or plasma activation.

Figure 17A:
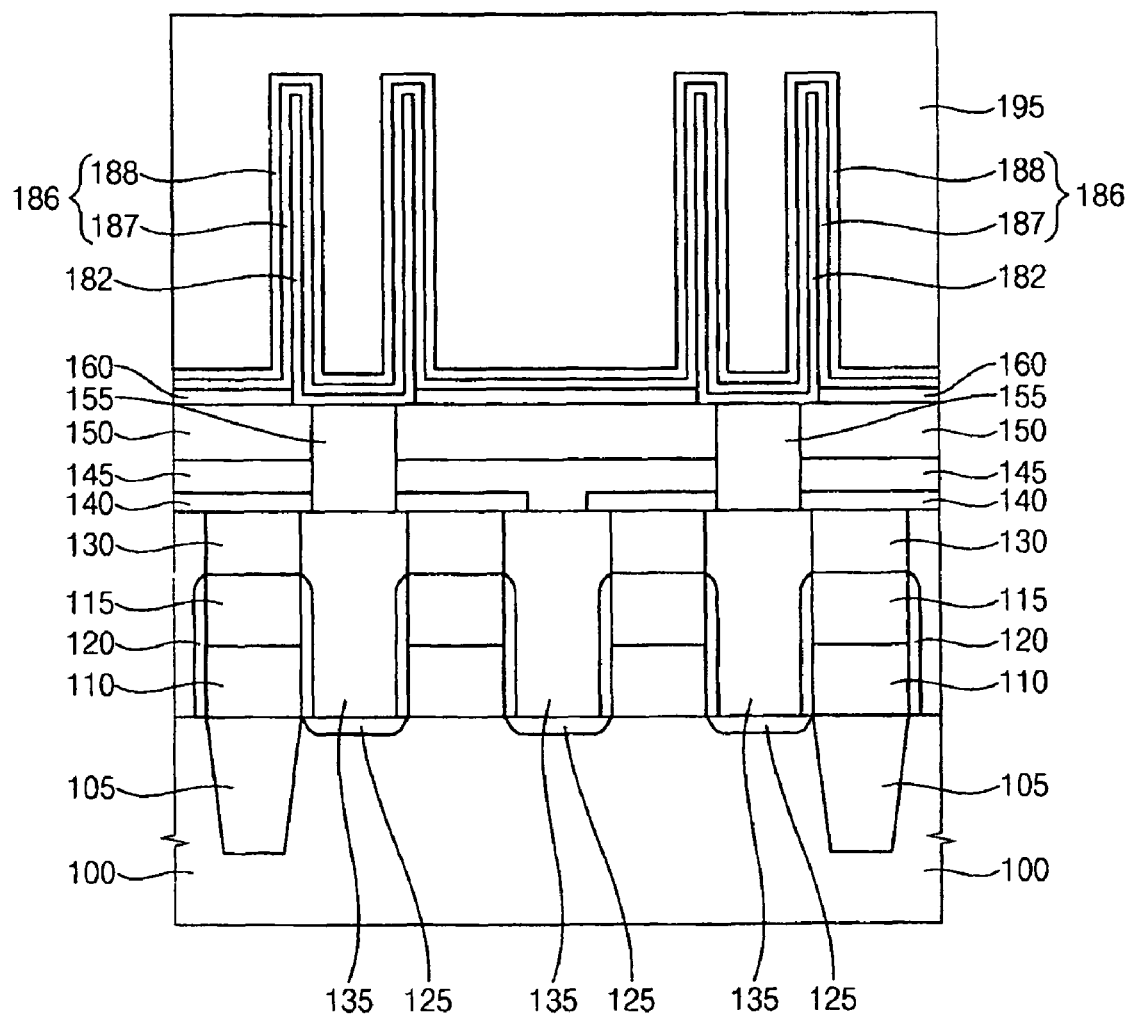
Figure 17B:
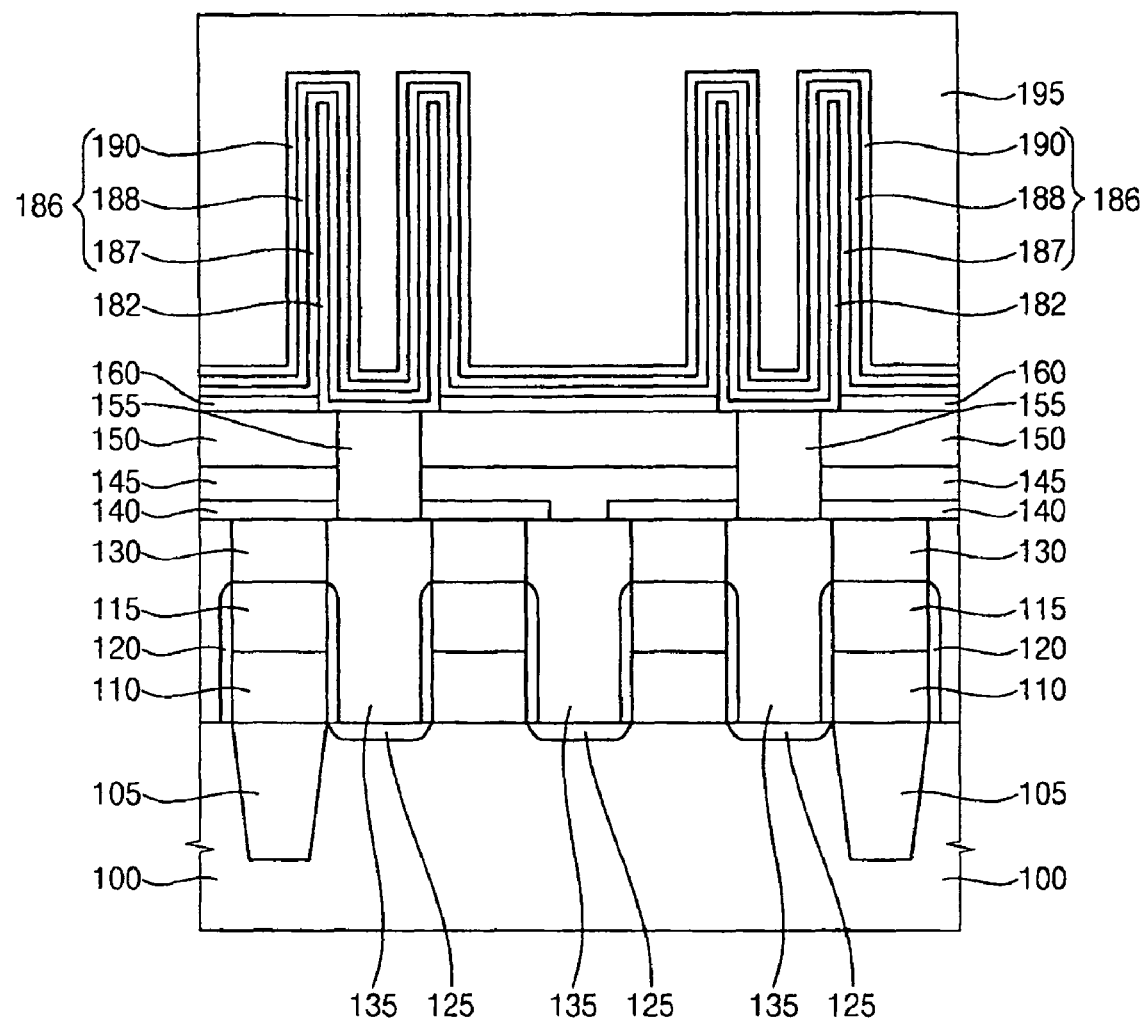

Referring to FIGS. 17A and 17B, an upper electrode 195 can be formed on the dielectric layer 186. The upper electrode 195 can be formed of a conductive material (e.g., TiN, Ti, TaN, Pt, etc.). Although not illustrated in the drawings, an insulating interlayer and a metal wiring can be formed on or over the upper electrode. As a result, a high-performance dynamic random access memory (DRAM) device having a reduced defect or leakage current can be obtained.

The cross-sectional views of FIGS. 18 through 21B illustrate a method of manufacturing a capacitor of a logic device according to example embodiments.

Figure 18:
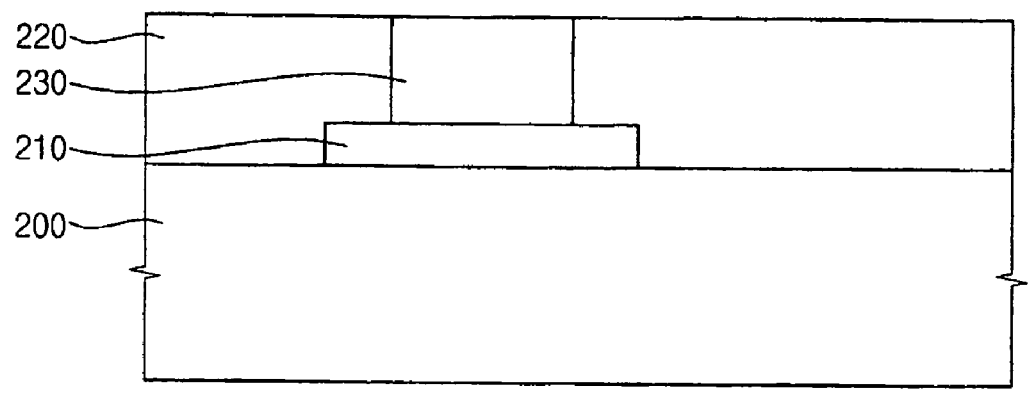

Referring to FIG. 18, a lower wiring 210 can be formed on a semiconductor substrate 200. The lower wiring 210 can be adapted to apply power to a device and can be formed of a conductive material (e.g., a metal or polysilicon doped with impurities). A first insulating interlayer 220 can be formed on the semiconductor substrate 200 to cover the wiring 210. A lower contact hole (not illustrated) can be formed in the first insulating interlayer 220 to expose the lower wiring 210, and then a lower contact plug 230 can be formed in the lower contact hole. The lower contact plug 230 can be formed of, for example, copper or tungsten.

Figure 19A:
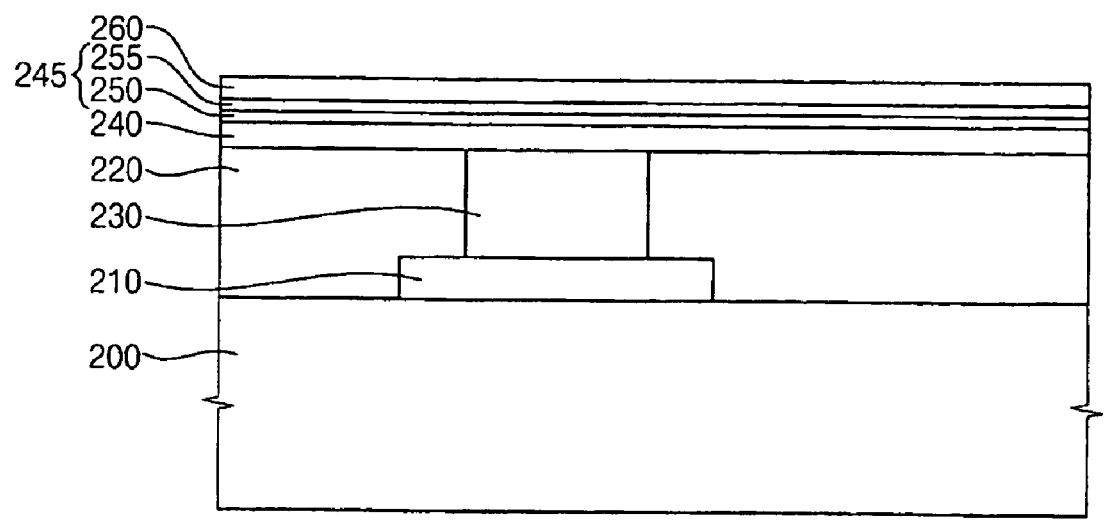
Figure 19B:
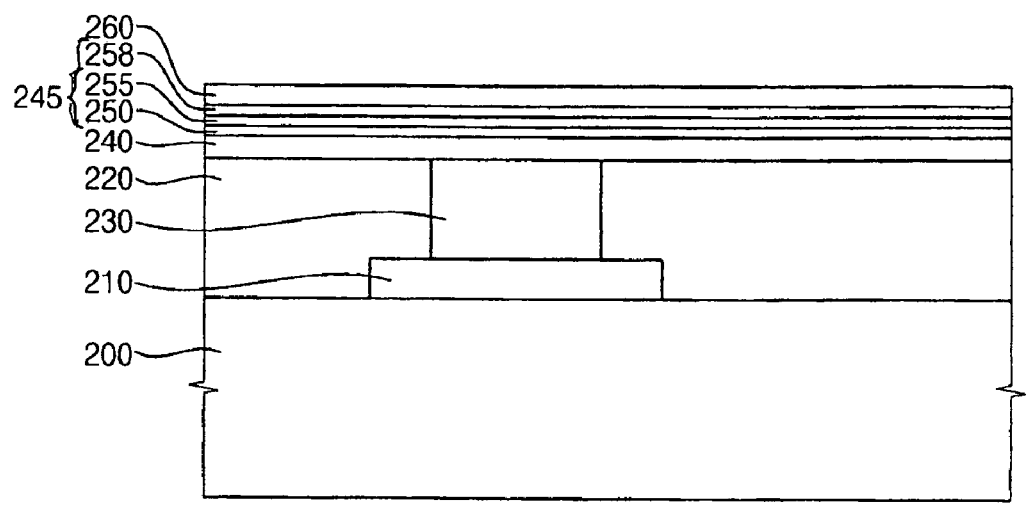

Referring to FIGS. 19A and 19B, a lower electrode layer 240 of a capacitor can be formed on the lower contact plug 230. A material of the lower electrode layer 240 can be, for example, TiN, Ti, TaN, Pt, etc. A dielectric layer 245 of a capacitor can be formed on the lower electrode 240. The dielectric layer 245 can be formed by the above-mentioned methods of forming a dielectric layer of zirconium oxide-based multi-layer composites according to example embodiments. In some example embodiments, the dielectric layer 245 can be formed to have a first zirconium oxide film 250 and a zirconium carbo-oxynitride film 255, as illustrated in FIG. 19A. In other example embodiments, the dielectric layer 245 can be formed to have a first zirconium oxide film 250, a zirconium carbo-oxynitride film 255 and a second zirconium oxide film 258, as illustrated in FIG. 19B. For example, the dielectric layer 245 can be formed by the process for forming the dielectric layer 186 as illustrated with reference to FIGS. 16A and 16B. An upper electrode layer 260 can be formed on the dielectric layer 245; the upper electrode layer 260 can be formed of a conductive material (e.g., TiN, Ti, TaN, Pt, etc.).

Figure 20A:
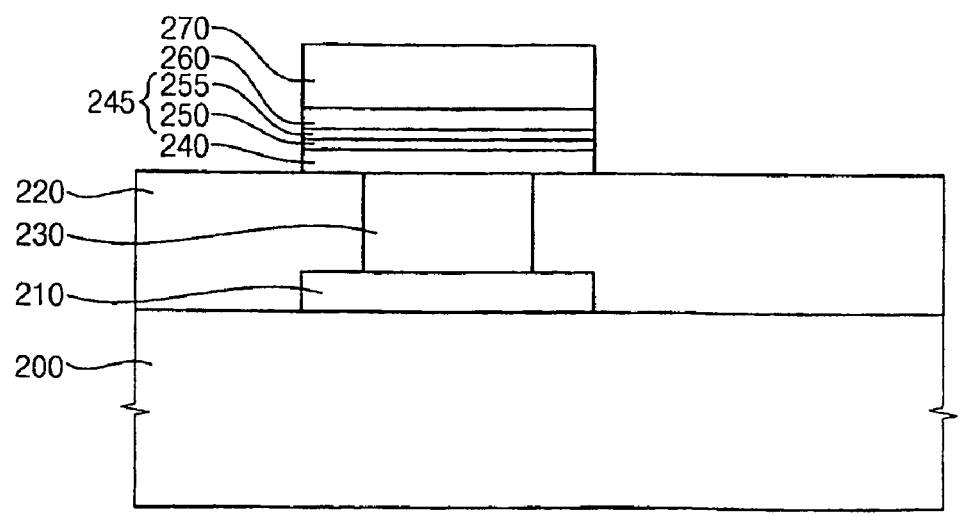
Figure 20B:
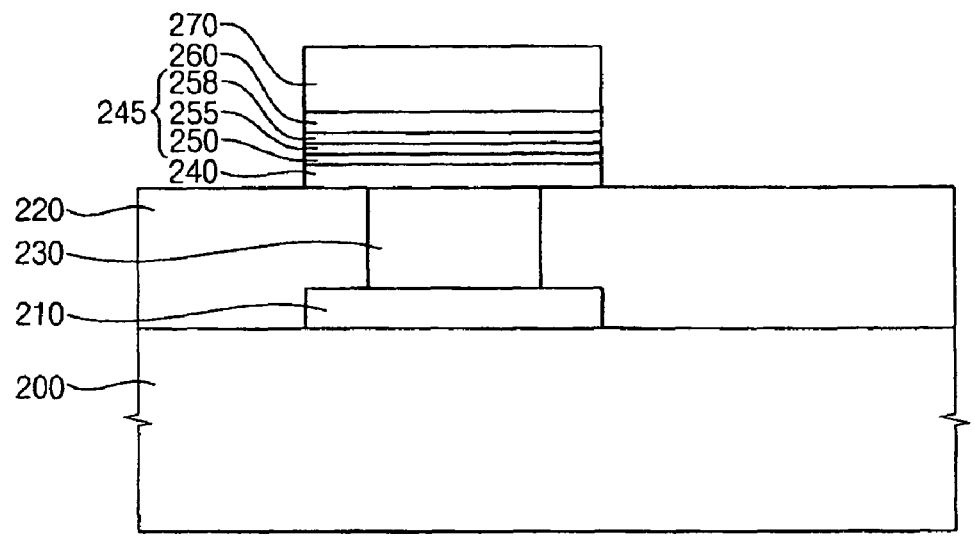

Referring to FIGS. 20A and 20B, a dummy upper electrode 270 can be formed on the upper electrode layer 260. The dummy upper electrode 270 can protect an upper electrode during a subsequent etching process and can provide a structure for readily connecting the upper electrode to an upper wiring. The upper electrode layer 260, the dielectric layer 245 and the lower electrode layer 240 can be sequentially patterned using the dummy upper electrode 270 to form a lower electrode 240, a dielectric layer pattern 245 and an upper electrode 260 on the lower contact plug 230.

Figure 21A:
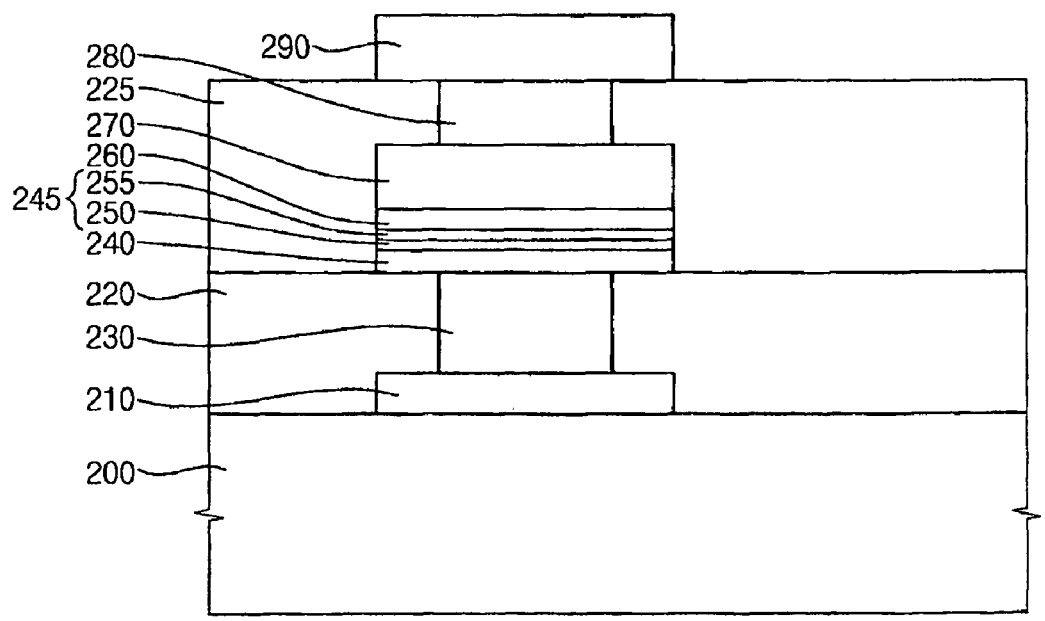
Figure 21B:
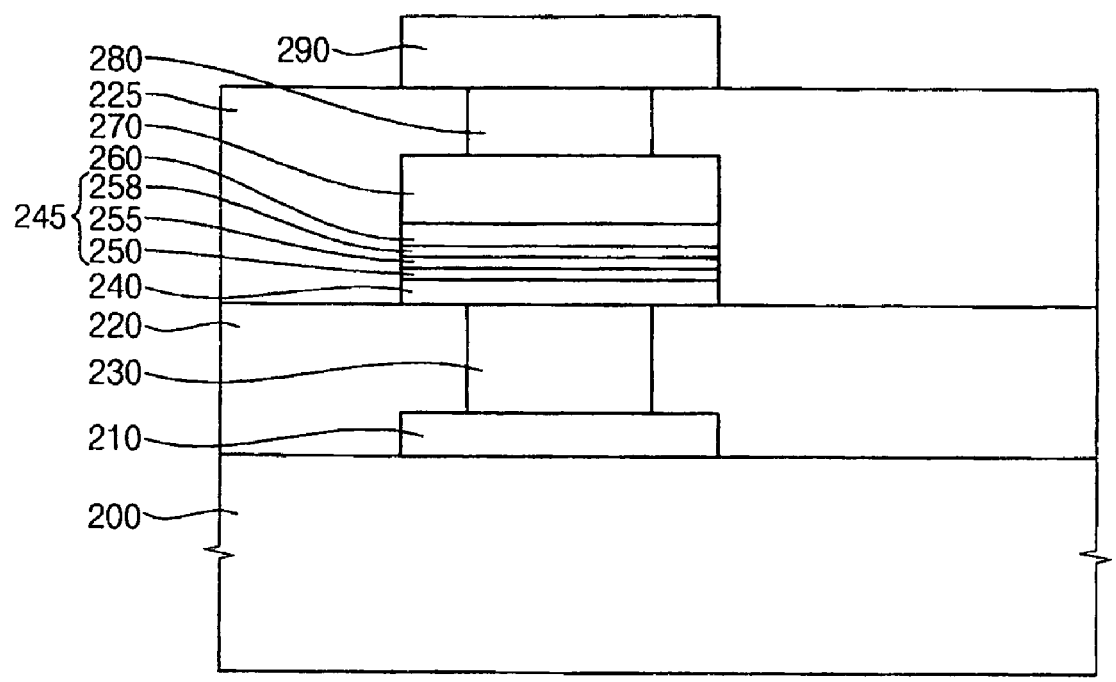

Referring to FIGS. 21A and 21B, a second insulating interlayer 225 can be formed on the first insulating interlayer 220 to cover the dummy upper electrode 270. A material of the second insulating interlayer 225 can be the same as or different from that of the first insulating interlayer 220. An upper contact hole (not illustrated) can be formed in the second insulating interlayer 225 to expose the dummy upper electrode 270, and then an upper contact plug 280 can be formed in the upper contact hole. The upper contact plug 280 can make contact with the dummy upper electrode 270, and an upper wiring 290 can be formed on the upper contact plug 280.

As mentioned above, a capacitor having a dielectric layer of zirconium-oxide-based multi-layer composites can be suitably employed in a logic device to reduce a leakage current through the dielectric layer.

The cross-sectional views of FIGS. 22 through 25B illustrate a method of manufacturing a decoupling capacitor of a logic device according to example embodiments.

Figure 22:
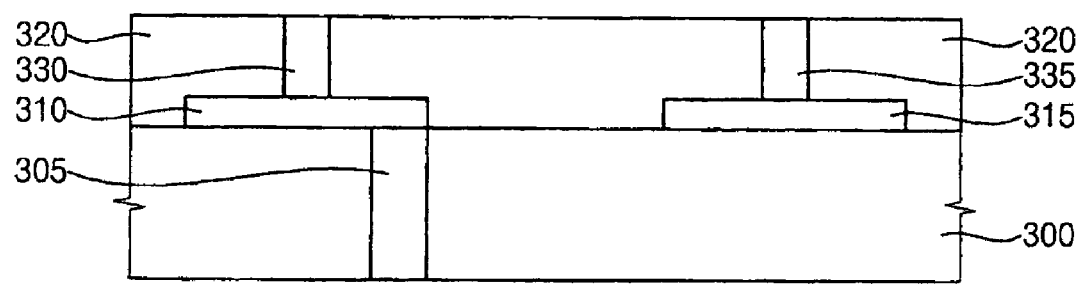

Referring to FIG. 22, a ground line 305 can be formed in or through a semiconductor substrate 300. First contact pads 310, 315 can be formed on the semiconductor substrate 300 and can be connected with the ground line 305 or a power supply line (not illustrated); the first contact pads 310, 315 can be formed of a metal. A first insulating interlayer 320 can be formed on the semiconductor substrate 300 to cover the first contact pads 310, 315; the first insulating interlayer 320 can be formed of an insulation material [e.g., boron-doped phosphosilicate glass (BPSG), high-density-plasma chemical vapor deposition (HDP-CVD) oxide, etc.]. First contact holes (not illustrated) can be formed in the first insulating interlayer 320 to expose the first contact pads 310, 315; and then first contact plugs 330, 335 can be formed in the first contact holes. The first contact plugs 330, 335 can be formed of a metal (e.g., Cu, W, etc.).

Figure 23:
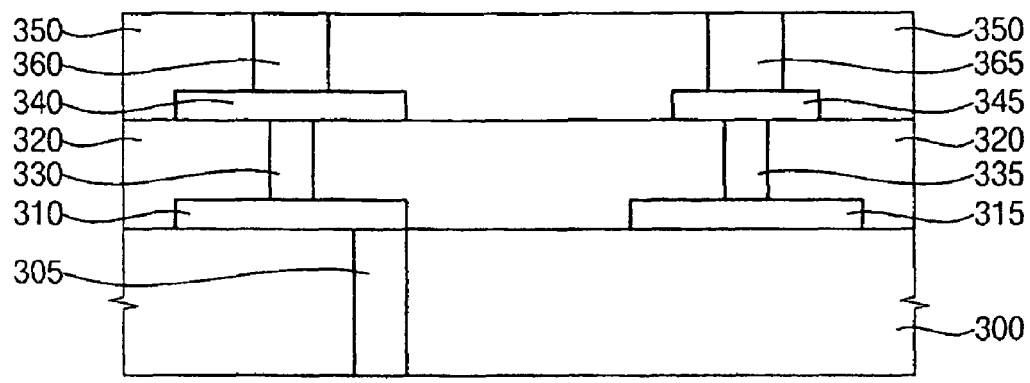

Referring to FIG. 23, second contact pads 340, 345, a second insulating interlayer 350 and second contact plugs 360, 365 can be formed on the first insulating interlayer 320. Formation of the second contact pads 340, 345, the second insulating interlayer 350 and the second contact plugs 360, 365 can be the same as or similar to formation of the first contact pads 310, 315, the first insulating interlayer 320 and the first contact plugs 330, 335.

Figure 24A:
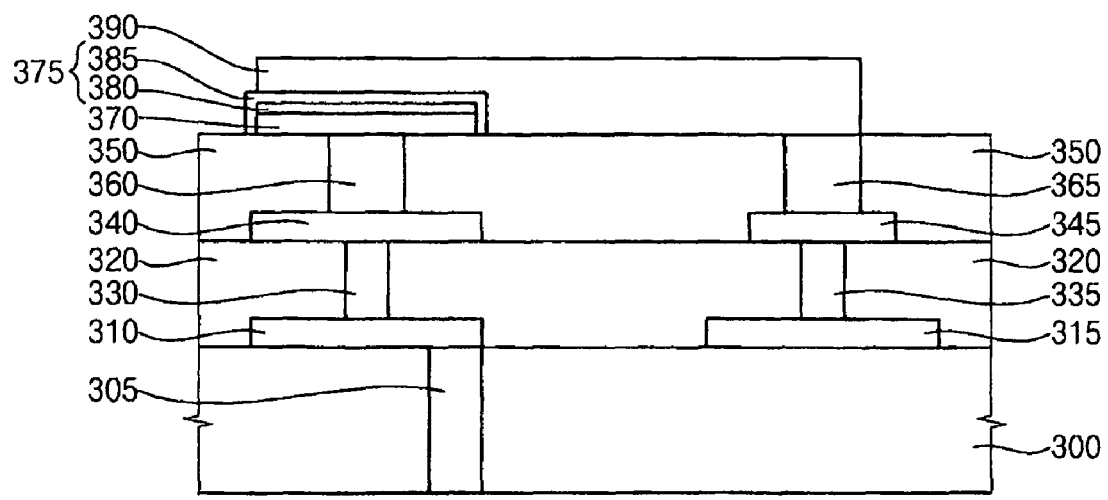
Figure 24B:
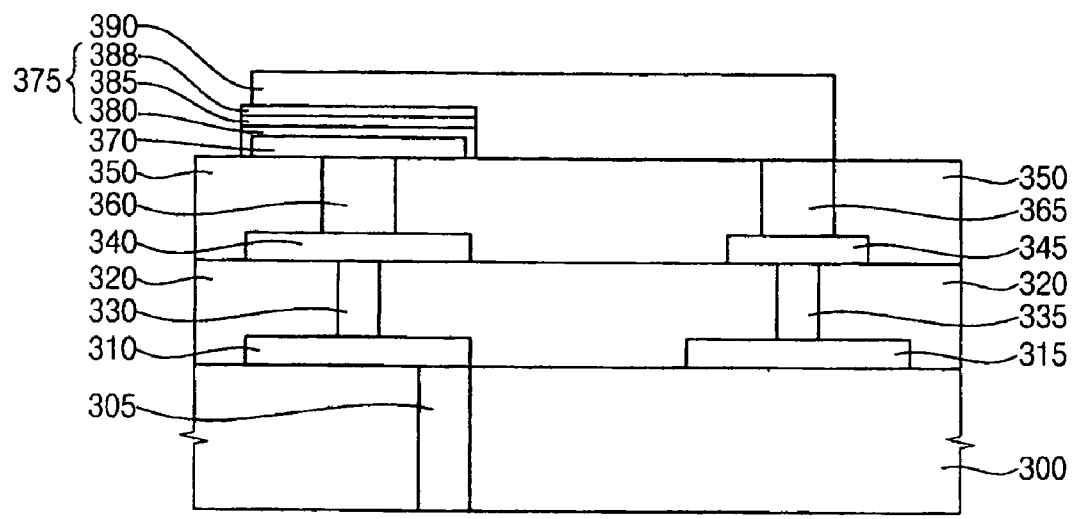

Referring to FIGS. 24A and 24B, a lower electrode 370 of a capacitor can be formed on the second contact plug 360 and can be electrically connected with the ground line 305. The lower electrode 370 can be formed of a conductive material (e.g., TiN, Ti, TaN, Pt, etc.).

A dielectric layer 375 of a capacitor can be formed on the lower electrode 370 by the above-mentioned methods of forming a dielectric layer of zirconium-oxide-based multi-layer composites according to example embodiments. In some example embodiments, the dielectric layer 375 can be formed to have a first zirconium oxide film 380 and a zirconium carbo-oxynitride film 385, as illustrated in FIG. 24A. In other example embodiments, the dielectric layer 375 can be formed to have a first zirconium oxide film 380, a zirconium carbo-oxynitride film 385 and a second zirconium oxide film 388, as illustrated in FIG. 24B. For example, the dielectric layer 375 can be formed by the process for forming the dielectric layer 186 as illustrated with reference to FIGS. 16A and 16B.

An upper electrode 390 can be formed on the dielectric layer 375; the upper electrode 390 can be formed of a conductive material (e.g., TiN, Ti, TaN, Pt, etc.). One portion of the upper electrode 390 can be formed on the dielectric layer, and another portion of the upper electrode 390 can be connected to the second contact plug 365, which can be electrically connected to the power supply line.

Figure 25A:
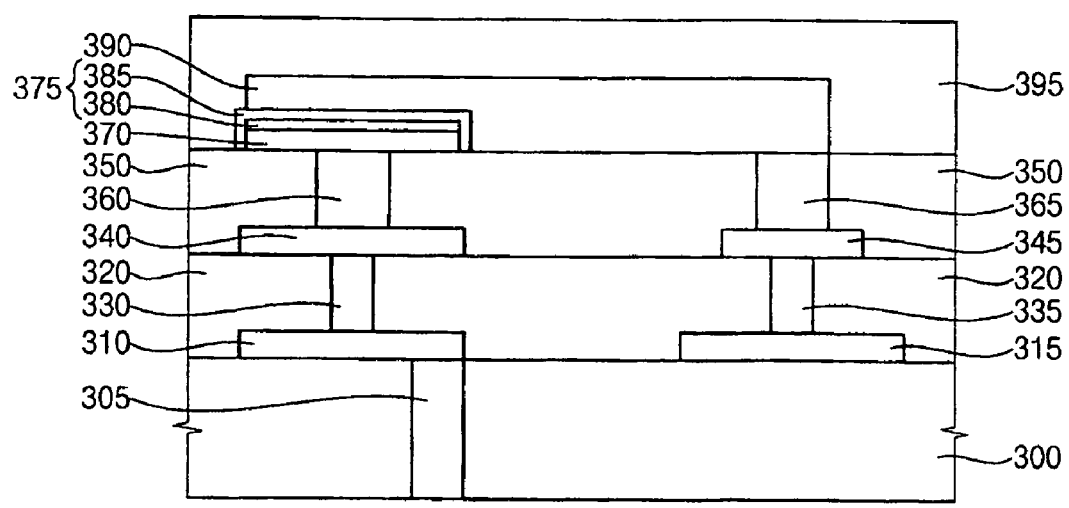
Figure 25B:
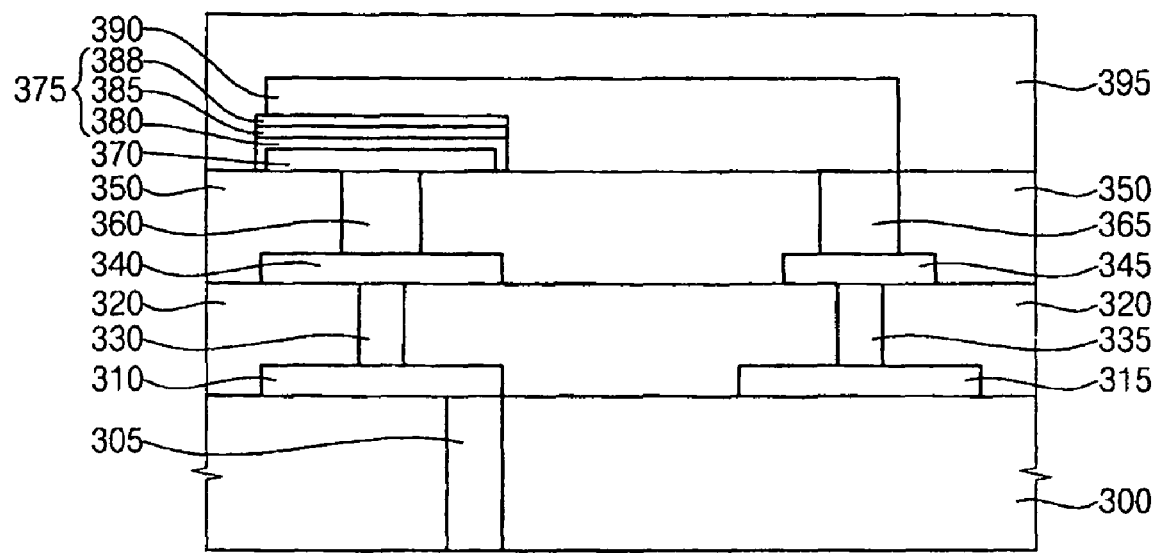

Referring to FIGS. 25A and 25B, a passivation layer 395 can be formed on the upper electrode 390. As a result, a decoupling capacitor having high capacitance to improve the operational speed of a logic device can be manufactured.

The cross-sectional views of FIGS. 26 through 30B illustrate a method of manufacturing a flash memory device according to example embodiments.

Figure 26:
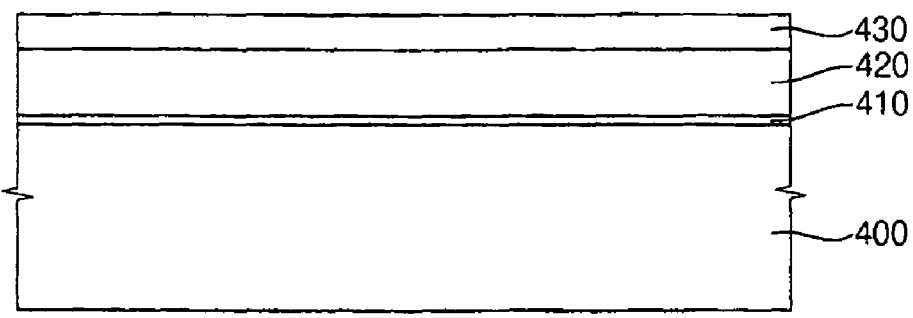

Referring to FIG. 26, a tunnel oxide layer 410, a floating gate electrode layer 420 and a hard mask layer 430 can be sequentially formed on a substrate 400. The substrate 400 can be a semiconductor substrate (e.g., a silicon wafer or an SOI substrate).

The tunnel oxide layer 410 can be formed by a thermal-oxidation process to a thickness of about 50 Å to about 100 Å. The tunnel oxide layer 410, having high durability and uniformity, can improve the operational stability of reading or writing in a device. A tunnel oxide layer 410 having such properties can be formed using a radical oxidation method.

The floating gate electrode layer 420 can be formed by a CVD process using a conductive material (e.g., polysilicon or a metal). The floating gate electrode layer 420 can be formed to a thickness of about 500 Å to about 1,500 Å. Additionally, the floating gate electrode layer 420 can be a single layer formed by a single deposition, or the floating gate electrode layer 420 can be multi-layer—having at least two layers formed by a stepwise deposition in which a first layer can be formed with a relatively thin thickness (e.g., about 300 Å) and a second layer or an additional layer can be formed on the first layer. The multi-layer floating gate electrode layer 420 can improve characteristics of a device.

The hard mask layer 430 can be a single layer or multi-layer. For example, the hard mask layer 430 can be obtained by forming a lower layer of oxide or nitride on the floating gate electrode layer 420, forming an organic layer on the lower layer, and then forming an anti-reflective layer of nitride on the organic layer.

Figure 27:
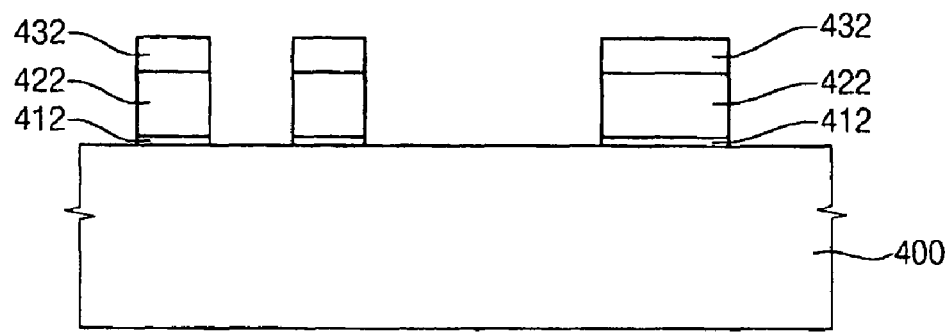

Referring to FIG. 27, the hard mask layer 430, the floating gate electrode layer 420 and the tunnel oxide layer 410 can be sequentially patterned by a photolithography process. For example, the hard mask layer 430 can be etched using a photoresist pattern (not illustrated) as a mask; and then the floating gate electrode layer 420 and the tunnel oxide layer 410 can be etched using a hard mask layer pattern 432 as an etching mask to form a floating gate electrode 422 and a tunnel oxide layer pattern 412 on the substrate 400. By patterning the hard mask layer 430, the floating gate electrode layer 420 and the tunnel oxide layer 410, portions of the substrate 400 can be exposed; and an isolation layer can be formed at the exposed portions of the substrate 400. The distance between floating gate electrodes 422 formed in a memory cell region of the substrate 400 can be relatively narrow, and the distance between floating gate electrodes 422 formed in a high-voltage transistor region of the substrate 400 can be relatively wide.

Figure 28:
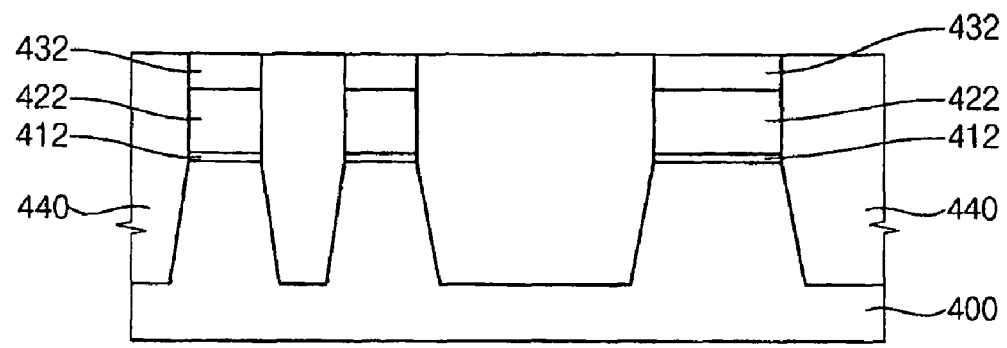

Referring to FIG. 28, a trench hole (not illustrated) can be formed at the exposed portions of the substrate 400 using a floating gate electrode structure as a mask. The trench hole can be filled with an insulation material, and thus the trench hole can have a slope relative to the substrate 400 to reduce a concentration of stress to a channel of the device. The stress can be generated from a difference in composition of the insulation material and a material of the substrate 400. An isolation layer 440 can be formed from a spin-on glass (SOG) material having polysilazane or an undoped silicate glass (USG) to reduce generation of a void.

Figure 29A:
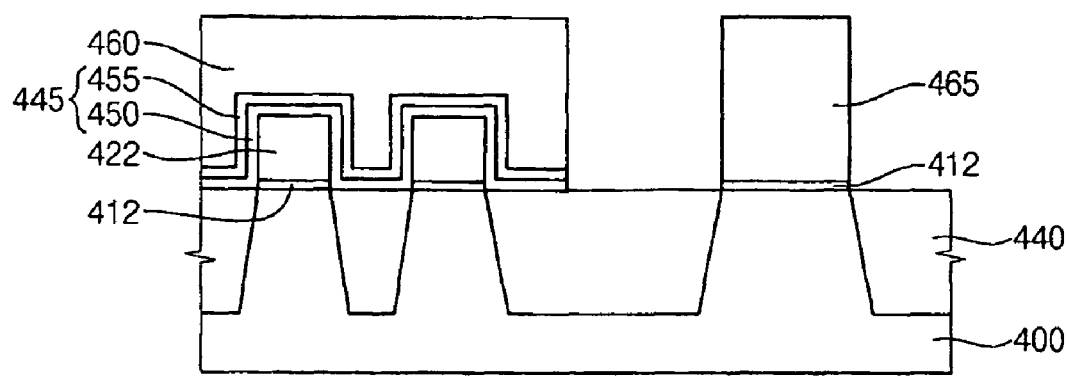
Figure 29B:
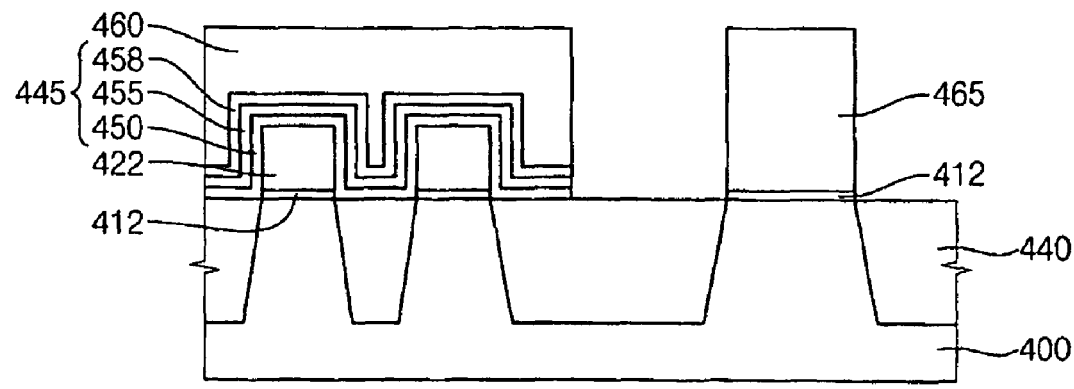

Referring to FIGS. 29A and 29B, an upper portion of the isolation layer 440 and the hard mask layer pattern 432 can be removed. A dielectric layer 445 can be formed on the floating gate electrode 422 and on the isolation layer 440. The dielectric layer 445 can be formed of a high dielectric material to raise a coupling ratio; and the dielectric layer 445 can be formed to a thickness of, e.g., about 100 Å to about 200 Å.

The dielectric layer 445 can be formed by the above-mentioned methods of forming a dielectric layer of zirconium oxide-based multi-layer composites according to example embodiments. In some example embodiments, the dielectric layer 455 can be formed to have a first zirconium oxide film 450 and a zirconium carbo-oxynitride film 455, as illustrated in FIG. 29A. In other example embodiments, the dielectric layer 445 can be formed to have a first zirconium oxide film 450, a zirconium carbo-oxynitride film 455 and a second zirconium oxide film 458, as illustrated in FIG. 29B. For example, the dielectric layer 445 can be formed by the process for forming the dielectric layer 186 as illustrated with reference to FIGS. 16A and 16B.

A control gate electrode 460 can be formed on the dielectric layer 445 in the memory cell region. In the high-voltage transistor region, the dielectric layer 445 can be removed from the floating gate electrode 422, and a control gate electrode 465 can be formed on the floating gate electrode 422; thus, a metal-oxide semiconductor (MOS) transistor having two gate layers can be obtained.

Figure 30A:
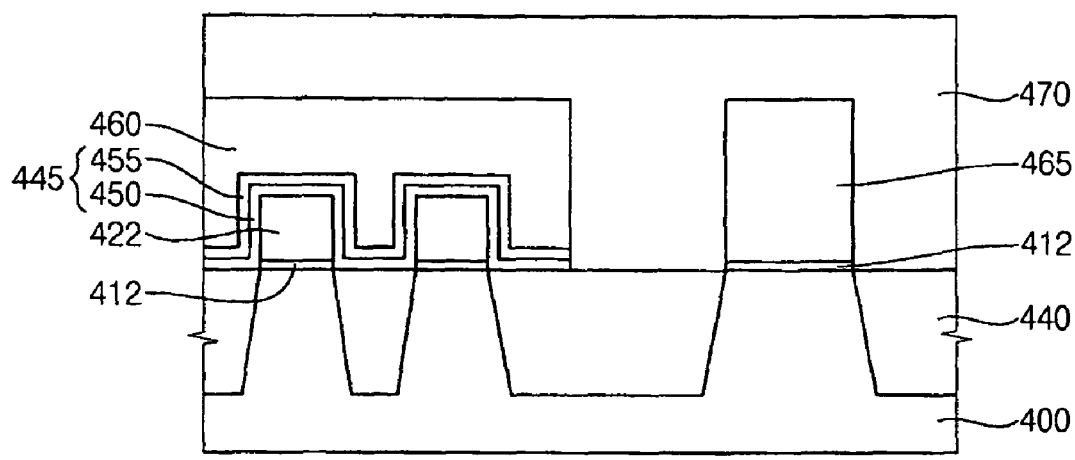
Figure 30B:
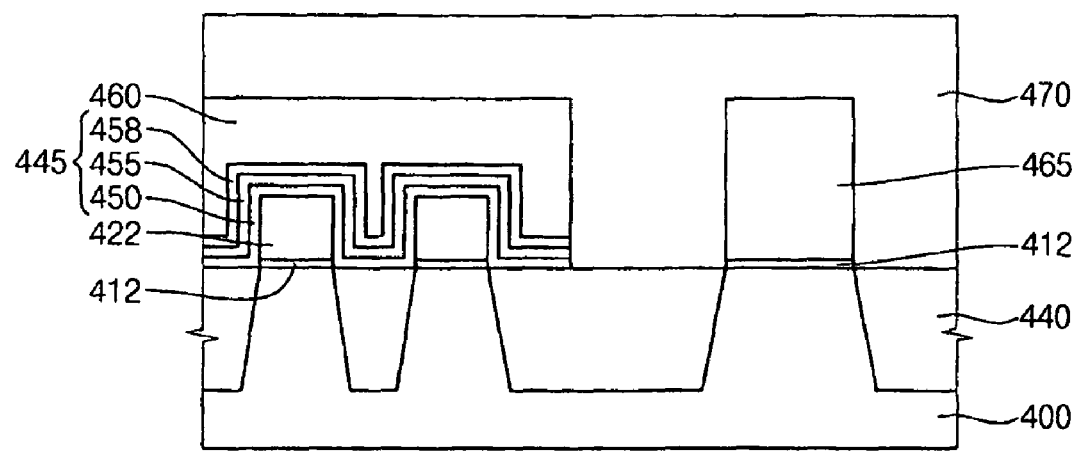

Referring to FIGS. 30A and 30B, an insulating interlayer 470 can be formed on the control gate electrode 460, 465. The insulating interlayer 470 can be formed to have a single layer or to be multi-layer (i.e., having at least two layers); and the insulating interlayer 470 can be formed of an insulation material (e.g., an HDP-CVD oxide). As an integration degree of a device increases, a general CVD process can generate large voids while filling a hole, whereas an HDP-CVD process can reduce generation of a void because a fine chemical etching and a deposition can occur simultaneously. For example, the insulating interlayer 470 can be formed by first depositing an HDP-CVD oxide (e.g., to a thickness of about 2,000 Å), then slightly wet-etching the deposited layer, and then depositing additional HDP-CVD oxide (e.g., to a thickness of about 6,000 Å or more).

Although not illustrated in the drawings, a contact hole can be formed in the insulating interlayer 470. A metal contact plug filling the contact hole and a metal line can be formed in or on the insulating interlayer 470. The metal line can be formed of a highly conductive material (e.g., aluminum, tungsten or copper).

Accordingly, a flash memory device having a dielectric layer of zirconium-oxide-based multi-layer composites can have a reduced leakage current and a high coupling ratio.

The cross-sectional views of FIGS. 31A through 32B illustrate a method of manufacturing a gate structure according to example embodiments.

Figure 31A:
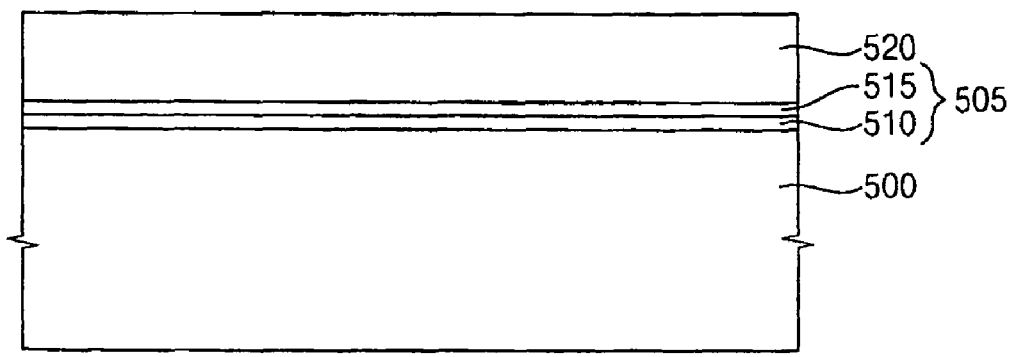
Figure 31B:
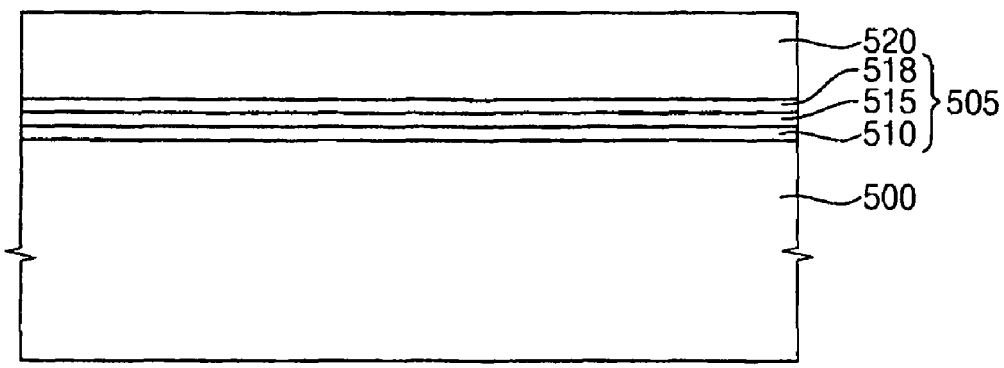

Referring to FIGS. 31A and 31B, a gate dielectric layer 505 can be formed on the substrate 500. For example, the gate dielectric layer 505 can be formed by the above-mentioned methods of forming a dielectric layer of zirconium-oxide-based multi-layer composites according to example embodiments. In some example embodiments, the gate dielectric layer 505 can be formed to have a first zirconium oxide film 510 and a zirconium carbo-oxynitride film 515, as illustrated in FIG. 31A. In other example embodiments, the gate dielectric layer 505 can be formed to have a first zirconium oxide film 510, a zirconium carbo-oxynitride film 515 and a second zirconium oxide film 518, as illustrated in FIG. 31B. For example, the gate dielectric layer 505 can be formed by the process for forming the dielectric layer 186 as illustrated with reference to FIGS. 16A and 16B. The gate dielectric layer 505 formed by the method can have a high dielectric constant and a reduced leakage current, so the gate dielectric layer 505 can be usefully employed in a gate dielectric of a transistor.

A gate electrode layer 520 can be formed on the gate dielectric layer 505. The gate electrode layer 520 can be formed of a conductive material (e.g., W, TiN, Ti, TaN, Pt, polysilicon, etc.)

Figure 32A:
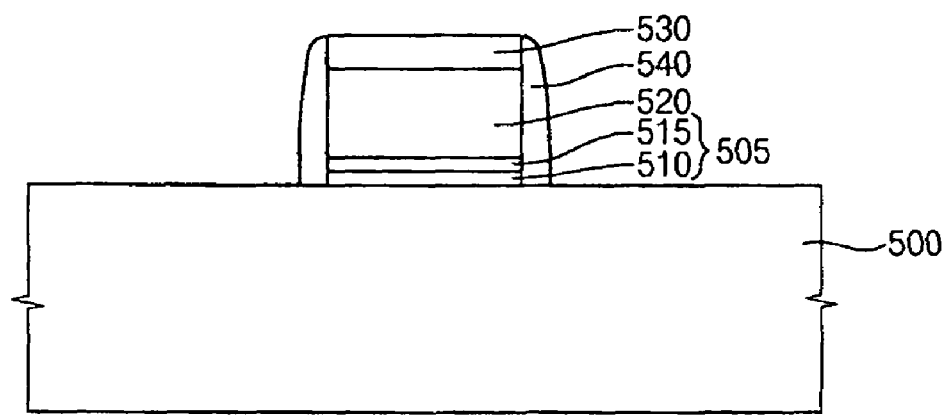
Figure 32B:
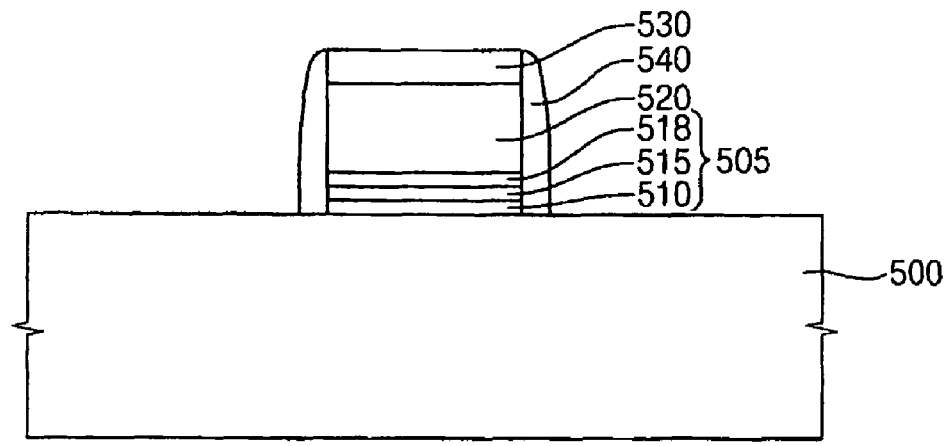

Referring to FIGS. 32A and 32B, a gate mask layer (not illustrated) can be formed on the gate electrode layer 520, and then the gate mask layer can be patterned by a photolithography process to form a gate mask pattern 530. The gate electrode layer 520 and the gate dielectric layer 505 can be patterned using the gate mask pattern 530 as an etching mask to form a gate electrode 520 and a gate dielectric layer pattern 505 on the substrate 500. A gate spacer 540 can be formed on sidewalls of the gate electrode 520. Accordingly, a gate structure having enhanced characteristics can be obtained.

Figure 33:
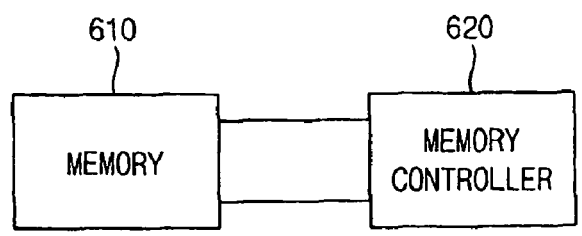
Figure 34:
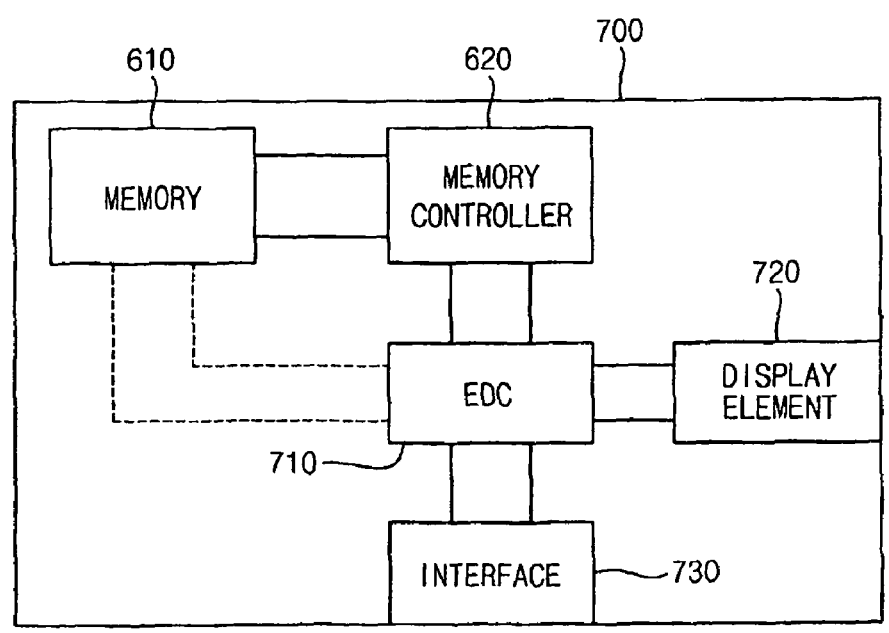
Figure 35:
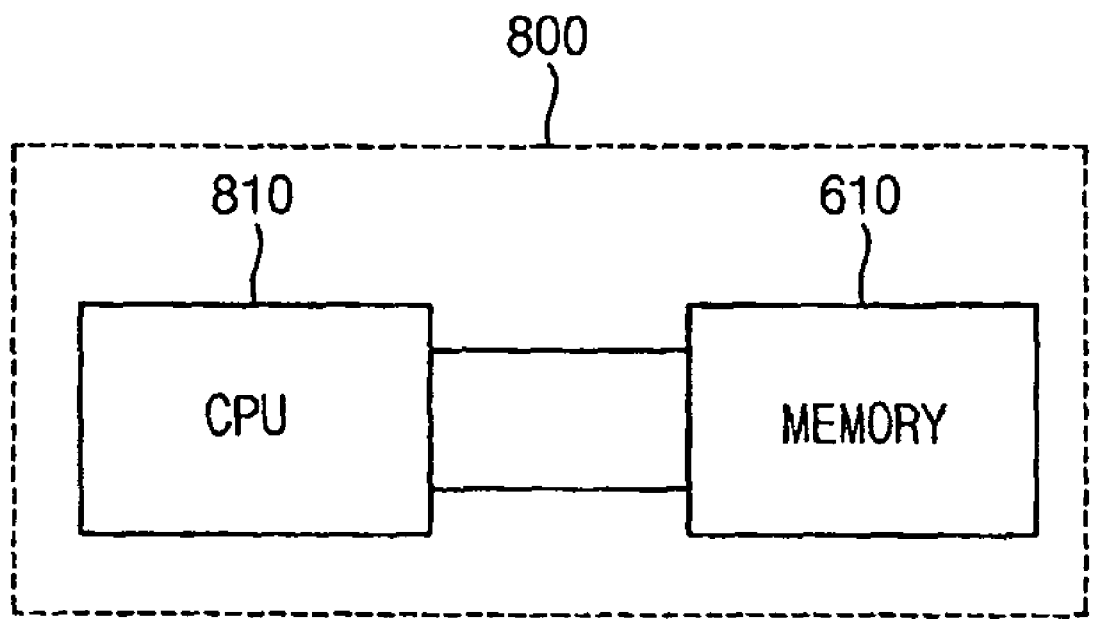

The block diagrams of FIGS. 33 through 35 illustrate systems including a memory device in accordance with example embodiments.

Referring to FIG. 33, a memory controller 620 can be connected to memory 610. The memory 610 can be a dynamic random access memory (DRAM) device having a dielectric layer of zirconium oxide-based multi-layer composites in a capacitor, or the memory 610 can be a flash memory device having a dielectric layer of zirconium oxide-based multi-layer composites on a floating gate electrode, both which are described above. The flash memory device can be an NAND flash memory or an NOR flash memory. The memory controller 620 can provide the memory 610 with input signals to control operations of the memory 610. For example, in a memory card that includes the memory controller 620 and the memory 610, the memory controller 620 can transfer commands of a host to the memory 610 to control input/output data and/or the memory controller 620 can control various data from the memory 610 based on an applied control signal. Such a structure or a relation can be employed in various digital devices using memory as well as the simple memory card. Further, the memory controller 620 can include the zirconium-oxide-based multi-layer composites as a dielectric layer of a capacitor or as a gate of a transistor in a logic circuit.

Referring to FIG. 34, a portable device 700 can be provided according to example embodiments. The portable device 700 can include memory 610 in the form of a DRAM device having a dielectric layer of zirconium-oxide-based multi-layer composites in a capacitor or in the form of a flash memory device having a dielectric layer of zirconium-oxide-based multi-layer composites on a floating gate electrode.

Examples of the portable device 700 can include an MP3 player, a video player, a portable multi-media player (PMP), etc.

The portable device 700 can include the memory 610, the memory controller 620, an encoder/decoder (EDC) 710, a display element 720 and an interface 730. Data can be input to or output from the memory 610 by way of the memory controller 620. As illustrated with the dashed lines of FIG. 34, data can be directly input from the EDC 710 to the memory 610, or data can be directly output from the memory 610 to the EDC 710.

The EDC 710 can encode data to be stored in the memory 610. For example, the EDC 710 can execute encoding for storing audio data and/or video data in the memory 610 of an MP3 player or a PMP player. Further, the EDC 710 can execute MPEG encoding for storing video data in the memory 610. Moreover, the EDC 710 can include multiple encoders to encode different types of data depending on their formats. For example, the EDC 710 can include an MP3 encoder for encoding audio data and an MPEG encoder for encoding video data.

The EDC 710 can also decode data that is output from the memory 610. For example, the EDC 710 can execute MP3 decoding to decode audio data from the memory 610. Further, the EDC 710 can execute MPEG decoding to decode video data from the memory 610. Moreover, the EDC 710 can include multiple decoders to decode different types of data depending on their formats. For example, the EDC 710 can include an MP3 decoder for audio data and an MPEG decoder for video data.

In other embodiments, the EDC 710 may include only a decoder. For example, encoded data can be input to the EDC 710, and then the EDC 710 can decode the input data for transfer into the memory controller 620 or the memory 610.

The EDC 710 can receive data to be encoded or data being encoded by way of the interface 730. The interface 730 can comply with established standards (e.g., FireWire, USB, etc.); accordingly, the interface 730 can include a FireWire interface, a USB interface, etc., and data can be output from the memory 610 by way of the interface 730.

The display element 720 can display a representation of user data that is output from the memory 610 and decoded by the EDC 710. Examples of the display element 720 can include a speaker outputting an audio representation of the data, a display screen outputting a video representation of the data, etc.

Referring to FIG. 35, a computing system 900 can be provided according to example embodiments. The computing system 800 can include the memory 610 and a central processing unit (CPU) 810 connected to the memory 610. The memory 610 can be a DRAM device having a dielectric layer of zirconium-oxide-based multi-layer composites in a capacitor or a flash memory device having a dielectric layer of zirconium-oxide-based multi-layer composites on a floating gate electrode. An example of the computing system 800 can be a laptop computer including flash memory as a main memory module. Additional examples of the computing system 800 can include digital devices in which the memory 610 for storing data and controlling functions can be built. The memory 610 can be directly connected to the CPU 810, or the memory 610 can be indirectly connected to the CPU 810 by buses. Although not illustrated in FIG. 35, other elements or devices can be included in the computing system 800.

According to example embodiments, the zirconium-oxide-based composite layer can be obtained by sequentially forming a first zirconium oxide layer and a zirconium carbo-oxynitride layer, or by further forming a second zirconium oxide layer on the zirconium carbo-oxynitride layer. The zirconium oxide-based composite layer can have a high dielectric constant and a thin equivalent oxide thickness. Therefore, a dimension of a dielectric layer in a device can be reduced, and a highly integrated device having an increased number of cells can be manufactured.

Further, the zirconium oxide/zirconium carbo-oxynitride/ zirconium oxide layer obtained by example embodiments can have improved leakage current characteristics, because the second zirconium oxide layer is formed under a relatively weak oxidation atmosphere to reduce the oxidation of the zirconium carbo-oxynitride layer.

Additionally, the zirconium-oxide-based composite layer can have a high temperature of crystallization in comparison with a uniform zirconium oxide layer. Thus, generation of a leakage current through a crystallized portion can be reduced or suppressed, and a device having a uniform threshold voltage along a channel length can be obtained. Further, a temperature margin of a thermal process performed after forming the zirconium carbo-oxynitride layer can be raised.

The foregoing is illustrative of example embodiments and is not to be construed as limiting thereof. Although a few example embodiments have been described, those skilled in the art will readily appreciate that many modifications are possible in the example embodiments without materially departing from the novel teachings of example embodiments. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it may be to be understood that the foregoing may be illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
    forming a lower electrode on a semiconductor substrate;
    forming a first zirconium oxide layer on the lower electrode by performing a first deposition process using a first zirconium source and a first oxidizing gas;
    forming a zirconium carbo-oxynitride layer on the first zirconium oxide layer by performing a second deposition process using a second zirconium source, a second oxidizing gas and a nitriding gas;
    forming a second zirconium oxide layer on the zirconium carbo-oxynitride layer by performing a third deposition process using a third zirconium source and a third oxidizing gas under an oxidation atmosphere sufficiently weak to reduce oxidization of the zirconium carbo-oxynitride layer; and then
    forming an upper electrode on the second zirconium oxide layer.

2. The method of claim 1, wherein forming the first zirconium oxide layer on the lower electrode comprises:
    (a) supplying the first zirconium source to the lower electrode to form an adsorption layer of the first zirconium source on the lower electrode;
    (b) providing a purging gas to remove a non-adsorbed portion of the first zirconium source;
    (c) providing the first oxidizing gas to oxidize the adsorption layer of the first zirconium source; and (d) providing a purging gas to remove a non-reacted portion of the first oxidizing gas.

3. The method of claim 2, wherein forming the zirconium carbo-oxynitride layer on the first zirconium oxide layer comprises:

(e) supplying the second zirconium source to the first zirconium oxide layer to form an adsorption layer of the second zirconium source on the first zirconium oxide layer;

(f) providing a purging gas to remove a non-adsorbed portion of the second zirconium source;

(g) supplying the second oxidizing gas to the first zirconium oxide layer to form an oxidized adsorption layer of the second zirconium source on the first zirconium oxide layer;

(h) providing a purging gas to remove a non-reacted portion of the second oxidizing gas;

(i) supplying the nitriding gas to the oxidized adsorption layer of the second zirconium source to form a zirconium carbo-oxynitride layer on the first zirconium oxide layer; and (j) providing a purging gas to remove a non-reacted portion of the nitriding gas.

4. The method of claim 3, wherein the steps from (e) through (j) are repeated in a cycle.

5. The method of claim 3, wherein the steps from (e) through (j) are repeated in a cycle to form a plurality of atomic layers of zirconium carbo-oxynitride on the first zirconium oxide layer, and wherein the plurality of atomic layers of zirconium carbo-oxynitride has a chemical formula of $ZrO_{2-x-y}C_xN_y$, in which x and y satisfy $0<x<2$, $0<y<2$ and $0<x+y<2$, and at least two of the atomic layers have different values for at least one of x and y from each other.

6. The method of claim 3, wherein the steps from (e) through (j) are repeated in a cycle to form a plurality of atomic layers of zirconium carbo-oxynitride on the first zirconium oxide layer, and wherein the plurality of atomic layers of zirconium carbo-oxynitride has a chemical formula of $ZrO_{2-x-y}C_xN_y$, in which x and y satisfy $0<x<2$, $0<y<2$ and $0<x+y<2$, and the plurality of atomic layers has a repeating unit of at least two atomic layers that have different values for at least one of x and y from each other.

7. The method of claim 3, wherein the nitriding gas reacts with the oxidized adsorption layer of the second zirconium source in a reaction activated by plasma.

8. The method of claim 1, wherein each of the first and second zirconium sources includes tetrakis(dialkylamino)zirconium.

9. The method of claim 1, wherein each of the first and the second oxidizing gases independently includes at least one gas selected from oxygen ($O_2$), ozone ($O_3$) and water vapor ($H_2O$).

10. The method of claim 1, wherein the nitriding gas includes at least one gas selected from ammonia ($NH_3$), nitrous oxide ($N_2O$) and nitric oxide (NO).

11. The method of claim 1, wherein a reaction of the third zirconium source and the third oxidizing gas is not activated by plasma or is activated by plasma with an energy sufficiently low to reduce oxidization of the zirconium carbo-oxynitride layer.

12. The method of claim 1, wherein the third deposition process is performed without plasma activation using the third oxidizing gas including at least one of ozone ($O_3$) and water vapor ($H_2O$).

13. A method of manufacturing a semiconductor device, comprising:

forming a tunnel oxide layer on a semiconductor substrate; then forming a lower electrode on the semiconductor substrate;

forming a first zirconium oxide layer on the lower electrode by performing a first deposition process using a first zirconium source and a first oxidizing gas;

forming a zirconium carbo-oxynitride layer on the first zirconium oxide layer by performing a second deposition process using a second zirconium source, a second oxidizing gas and a nitriding gas; and forming an upper electrode on the zirconium carbo-oxynitride layer, wherein the lower electrode is provided as a floating gate electrode, wherein the first zirconium oxide layer and the zirconium carbo-oxynitride layer are provided as a dielectric layer, and wherein the upper electrode is provided as a control gate electrode.

14. A semiconductor device comprising:

a lower electrode formed on a semiconductor substrate;

a first zirconium oxide layer formed on the lower electrode;

a zirconium carbo-oxynitride layer having zirconium, oxygen, carbon and nitrogen formed on the first zirconium oxide layer;

a second zirconium oxide layer formed on the zirconium carbo-oxynitride layer; and an upper electrode formed on the second zirconium oxide layer, wherein the second zirconium oxide layer is between the zirconium carbo-oxynitride layer and upper electrode.

15. The semiconductor device comprising:

a lower electrode formed on a semiconductor substrate;

a tunnel oxide layer formed between the semiconductor substrate and the lower electrode;

a first zirconium oxide layer formed on the lower electrode;

a zirconium carbo-oxynitride layer having zirconium, oxygen, carbon and nitrogen formed on the first zirconium oxide layer; and an upper electrode formed on the zirconium carbo-oxynitride layer, wherein the lower electrode is provided as a floating gate electrode, wherein the first zirconium oxide layer and the zirconium carbo-oxynitride layer are provided as a dielectric layer, and wherein the upper electrode is provided as a control gate electrode.

* * * * *